United States Patent
Lin et al.

(10) Patent No.: US 9,136,246 B2
(45) Date of Patent: Sep. 15, 2015

(54) INTEGRATED CHIP PACKAGE STRUCTURE USING SILICON SUBSTRATE AND METHOD OF MANUFACTURING THE SAME

(75) Inventors: Mou-Shiung Lin, Hsinchu (TW); Jin-Yuan Lee, Hsinchu (TW); Ching-Cheng Huang, Hsinchu (TW)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 10/755,042

(22) Filed: Jan. 9, 2004

(65) Prior Publication Data

US 2004/0140556 A1   Jul. 22, 2004

Related U.S. Application Data

(62) Division of application No. 10/055,568, filed on Jan. 22, 2002.

(51) Int. Cl.
*H01L 23/12* (2006.01)
*H01L 23/00* (2006.01)
(Continued)

(52) U.S. Cl.
CPC ............... *H01L 24/97* (2013.01); *H01L 23/36* (2013.01); *H01L 23/49816* (2013.01);
(Continued)

(58) Field of Classification Search
CPC .............. H01L 23/522; H01L 23/5223; H01L 53/5228; H01L 2924/00; H01L 2224/73265; H01L 23/481; H01L 2924/15311; H01L 2224/1308; H01L 23/5389; H01L 23/49811; H01L 25/0657; H01L 23/5222; H01L 21/4853
USPC ................. 257/758, 700, 701, 750, 685, 680, 257/E23.178, E23.092, 528; 361/311
See application file for complete search history.

(56) References Cited

U.S. PATENT DOCUMENTS

| 2,920,232 A | 1/1960 | Evans |
| 3,504,214 A | 3/1970 | Lake et al. |

(Continued)

FOREIGN PATENT DOCUMENTS

| EP | 1094511 A2 | 4/2001 |
| JP | 360004253 | 1/1985 |

(Continued)

OTHER PUBLICATIONS

ROC Cancellation Case No. 090131210N01 Third Supplemental Cancellation Brief filed by ACE on May 13, 2010, with English Translated Summary.

(Continued)

*Primary Examiner* — Matthew Reames
*Assistant Examiner* — John Bodnar
(74) *Attorney, Agent, or Firm* — Seyfarth Shaw LLP

(57) ABSTRACT

An integrated chip package structure and method of manufacturing the same is by adhering dies on a silicon substrate and forming a thin-film circuit layer on top of the dies and the silicon substrate. Wherein the thin-film circuit layer has an external circuitry, which is electrically connected to the metal pads of the dies, that extends to a region outside the active surface of the dies for fanning out the metal pads of the dies. Furthermore, a plurality of active devices and an internal circuitry is located on the active surface of the dies. Signal for the active devices are transmitted through the internal circuitry to the external circuitry and from the external circuitry through the internal circuitry back to other active devices. Moreover, the chip package structure allows multiple dies with different functions to be packaged into an integrated package and electrically connecting the dies by the external circuitry.

42 Claims, 16 Drawing Sheets

(51) Int. Cl.
*H01L 23/36* (2006.01)
*H01L 23/498* (2006.01)
*H01L 23/538* (2006.01)
*H01L 23/64* (2006.01)

(52) U.S. Cl.
CPC ..... *H01L 23/49822* (2013.01); *H01L 23/5389* (2013.01); *H01L 24/19* (2013.01); *H01L 23/642* (2013.01); *H01L 23/645* (2013.01); *H01L 2221/68363* (2013.01); *H01L 2221/68377* (2013.01); *H01L 2224/0401* (2013.01); *H01L 2224/04105* (2013.01); *H01L 2224/12105* (2013.01); *H01L 2224/20* (2013.01); *H01L 2224/211* (2013.01); *H01L 2224/32225* (2013.01); *H01L 2224/73267* (2013.01); *H01L 2224/92244* (2013.01); *H01L 2224/97* (2013.01); *H01L 2924/01005* (2013.01); *H01L 2924/01029* (2013.01); *H01L 2924/01033* (2013.01); *H01L 2924/01078* (2013.01); *H01L 2924/01079* (2013.01); *H01L 2924/09701* (2013.01); *H01L 2924/10253* (2013.01); *H01L 2924/14* (2013.01); *H01L 2924/1517* (2013.01); *H01L 2924/15153* (2013.01); *H01L 2924/15174* (2013.01); *H01L 2924/15311* (2013.01); *H01L 2924/19041* (2013.01); *H01L 2924/19042* (2013.01); *H01L 2924/19043* (2013.01); *H01L 2924/351* (2013.01)

(56) References Cited

U.S. PATENT DOCUMENTS

| | | | | |
|---|---|---|---|---|
| 3,634,714 A | | 1/1972 | Anderson et al. | |
| 3,677,112 A | | 7/1972 | Keniston | |
| 3,903,590 A | | 9/1975 | Yokogawa | |
| 4,021,838 A | | 5/1977 | Warwick | |
| 4,235,498 A | | 11/1980 | Snyder | |
| 4,402,888 A | | 9/1983 | Runck | |
| 4,622,058 A | | 11/1986 | Leary-Renick et al. | |
| 4,685,998 A | | 8/1987 | Quinn | |
| 4,789,647 A | | 12/1988 | Peters | |
| 4,840,923 A | | 6/1989 | Flagello et al. | |
| 4,866,501 A | * | 9/1989 | Shanefield | 257/684 |
| 4,918,811 A | | 4/1990 | Eichelberger et al. | |
| 5,048,179 A | | 9/1991 | Shindo et al. | |
| 5,049,980 A | | 9/1991 | Saito et al. | |
| 5,055,321 A | | 10/1991 | Enomoto et al. | |
| 5,063,177 A | | 11/1991 | Geller et al. | |
| 5,073,814 A | | 12/1991 | Cole, Jr. et al. | |
| 5,081,563 A | | 1/1992 | Feng et al. | |
| 5,083,187 A | | 1/1992 | Lamson | |
| 5,095,402 A | | 3/1992 | Hernandez | |
| 5,099,306 A | | 3/1992 | Dunaway et al. | |
| 5,111,278 A | | 5/1992 | Eichelberger | |
| 5,149,662 A | | 9/1992 | Eichelberger | |
| 5,161,093 A | | 11/1992 | Gorczyca et al. | |
| 5,188,984 A | | 2/1993 | Nishiguchi | |
| 5,196,377 A | * | 3/1993 | Wagner et al. | 438/384 |
| 5,211,278 A | | 5/1993 | Mendenhall | |
| 5,226,232 A | | 7/1993 | Boyd | |
| 5,239,198 A | | 8/1993 | Lin et al. | |
| 5,241,456 A | | 8/1993 | Marcinkiewicz et al. | |
| 5,250,843 A | | 10/1993 | Eichelberger | |
| 5,281,151 A | * | 1/1994 | Arima et al. | 439/68 |
| 5,291,066 A | * | 3/1994 | Neugebauer et al. | 257/750 |
| 5,300,812 A | | 4/1994 | Lupinski | |
| 5,324,687 A | * | 6/1994 | Wojnarowski | 438/107 |
| 5,331,204 A | | 7/1994 | Kuroda et al. | |
| 5,334,874 A | | 8/1994 | Metzler et al. | |
| 5,336,928 A | | 8/1994 | Neugebauer et al. | |
| 5,353,195 A | | 10/1994 | Fillion et al. | |
| 5,353,498 A | | 10/1994 | Fillion et al. | |
| 5,359,496 A | | 10/1994 | Kornrumpf et al. | |
| 5,365,790 A | | 11/1994 | Chen et al. | |
| 5,366,906 A | | 11/1994 | Wojnarowski et al. | |
| 5,370,766 A | | 12/1994 | Desaigoudar | |
| 5,372,967 A | | 12/1994 | Sundaram | |
| 5,384,488 A | | 1/1995 | Golshan | |
| 5,388,328 A | | 2/1995 | Yokono et al. | |
| 5,394,490 A | | 2/1995 | Kato et al. | |
| 5,401,687 A | | 3/1995 | Cole et al. | |
| 5,416,356 A | | 5/1995 | Staudinger | |
| 5,422,513 A | | 6/1995 | Marcinkiewicz et al. | |
| 5,432,675 A | | 7/1995 | Sorimachi et al. | |
| 5,432,677 A | | 7/1995 | Mowatt et al. | |
| 5,434,751 A | * | 7/1995 | Cole et al. | 361/792 |
| 5,450,101 A | | 9/1995 | Ishida et al. | |
| 5,478,773 A | | 12/1995 | Dow | |
| 5,483,421 A | | 1/1996 | Gedney et al. | |
| 5,524,339 A | | 6/1996 | Gorowitz et al. | |
| 5,532,512 A | | 7/1996 | Fillion | |
| 5,534,727 A | | 7/1996 | Inoue | |
| 5,541,442 A | * | 7/1996 | Keil et al. | 257/533 |
| 5,548,091 A | | 8/1996 | DiStefano et al. | |
| 5,548,099 A | | 8/1996 | Cole, Jr. et al. | |
| 5,565,706 A | * | 10/1996 | Miura et al. | 257/723 |
| 5,566,441 A | | 10/1996 | Marsh et al. | |
| 5,576,517 A | | 11/1996 | Wojnarowski et al. | |
| 5,583,359 A | * | 12/1996 | Ng et al. | 257/306 |
| 5,602,059 A | | 2/1997 | Horiuchi et al. | |
| 5,606,198 A | | 2/1997 | Ono et al. | |
| 5,611,884 A | | 3/1997 | Bearinger et al. | |
| 5,629,240 A | | 5/1997 | Malladi | |
| 5,635,762 A | | 6/1997 | Gamand | |
| 5,648,448 A | * | 7/1997 | Marrocco et al. | 528/125 |
| 5,650,662 A | | 7/1997 | Edwards et al. | |
| 5,659,201 A | | 8/1997 | Wollesen | |
| 5,663,106 A | | 9/1997 | Karavakis et al. | |
| 5,665,989 A | | 9/1997 | Dangelo | |
| 5,668,399 A | | 9/1997 | Cronin et al. | |
| 5,691,248 A | | 11/1997 | Cronin | |
| 5,696,466 A | | 12/1997 | Li | |
| 5,717,245 A | * | 2/1998 | Pedder | 257/691 |
| 5,729,053 A | | 3/1998 | Orthmann | |
| 5,745,984 A | * | 5/1998 | Cole et al. | 29/834 |
| 5,757,072 A | | 5/1998 | Gorowitz et al. | |
| 5,757,079 A | | 5/1998 | McAllister et al. | |
| 5,763,108 A | | 6/1998 | Chang | |
| 5,767,564 A | | 6/1998 | Kunimatsu et al. | |
| 5,776,796 A | | 7/1998 | DiStefano et al. | |
| 5,786,239 A | | 7/1998 | Ohsawa et al. | |
| 5,789,303 A | | 8/1998 | Leung | |
| 5,792,594 A | | 8/1998 | Brown | |
| 5,817,541 A | | 10/1998 | Averkiou et al. | |
| 5,834,339 A | | 11/1998 | DiStefano et al. | |
| 5,834,832 A | | 11/1998 | Kweon et al. | |
| 5,834,844 A | | 11/1998 | Akagawa | |
| 5,841,193 A | | 11/1998 | Eichelberger | |
| 5,852,391 A | | 12/1998 | Watanabe et al. | |
| 5,854,001 A | | 12/1998 | Casey et al. | |
| 5,854,513 A | | 12/1998 | Kim | |
| 5,872,489 A | | 2/1999 | Chang et al. | |
| 5,874,770 A | | 2/1999 | Saia et al. | |
| 5,875,545 A | | 3/1999 | DiStefano et al. | |
| 5,883,435 A | | 3/1999 | Geffken | |
| 5,892,273 A | | 4/1999 | Iwasaki | |
| 5,892,288 A | | 4/1999 | Muraki et al. | |
| 5,919,548 A | | 7/1999 | Barron | |
| 5,929,510 A | | 7/1999 | Geller et al. | |
| 5,932,379 A | | 8/1999 | Burm et al. | |
| 5,939,214 A | | 8/1999 | Mahulikar et al. | |
| 5,939,782 A | * | 8/1999 | Malladi | 257/698 |
| 5,945,741 A | | 8/1999 | Ohsawa et al. | |
| 5,952,726 A | | 9/1999 | Liang | |
| 5,959,357 A | | 9/1999 | Korman | |
| 5,973,908 A | * | 10/1999 | Saia et al. | 361/311 |
| 5,994,766 A | | 11/1999 | Shenoy | |
| 6,002,592 A | | 12/1999 | Nakamura et al. | |
| 6,004,867 A | | 12/1999 | Kim, II et al. | |
| 6,008,070 A | | 12/1999 | Farnworth | |
| 6,008,102 A | | 12/1999 | Alford | |
| 6,010,956 A | | 1/2000 | Takiguchi et al. | |

(56) References Cited

U.S. PATENT DOCUMENTS

| | | | |
|---|---|---|---|
| 6,011,314 A | 1/2000 | Leibovitz | |
| 6,013,948 A | 1/2000 | Akram et al. | |
| 6,018,463 A | 1/2000 | Winslow et al. | |
| 6,020,220 A | 2/2000 | Gilleo et al. | |
| 6,022,792 A | 2/2000 | Ishii | |
| 6,025,995 A | 2/2000 | Marcinkiewicz | |
| 6,030,856 A | 2/2000 | DiStefano et al. | |
| 6,033,939 A | 3/2000 | Agarwala et al. | |
| 6,043,109 A | 3/2000 | Yang et al. | |
| 6,045,655 A | 4/2000 | DiStefano et al. | |
| 6,046,076 A | 4/2000 | Mitchell et al. | |
| 6,077,726 A | 6/2000 | Mistry | |
| 6,078,104 A | 6/2000 | Sakurai | |
| 6,080,605 A | 6/2000 | DiStefano et al. | |
| 6,087,199 A | 7/2000 | Pogge et al. | |
| 6,087,648 A | 7/2000 | Zhang et al. | |
| 6,093,584 A | 7/2000 | Fjelstad | |
| 6,097,096 A | 8/2000 | Gardner et al. | |
| 6,104,091 A | 8/2000 | Ito et al. | |
| 6,107,123 A | 8/2000 | DiStefano et al. | |
| 6,110,806 A | 8/2000 | Pogge | |
| 6,120,884 A | 9/2000 | Igarashi et al. | |
| 6,121,688 A | 9/2000 | Akagawa | |
| 6,125,039 A | 9/2000 | Suzuki | |
| 6,126,428 A | 10/2000 | Mitchell et al. | |
| 6,130,116 A | 10/2000 | Smith et al. | |
| 6,139,666 A | 10/2000 | Fasano et al. | |
| 6,144,100 A | 11/2000 | Shen | |
| 6,150,716 A | 11/2000 | MacQuarrie et al. | |
| 6,154,366 A | 11/2000 | Ma et al. | |
| 6,159,767 A | 12/2000 | Eichelberger | |
| 6,163,456 A | 12/2000 | Suzuki et al. | |
| 6,168,965 B1 | 1/2001 | Malinovich et al. | |
| 6,169,319 B1 | 1/2001 | Malinovich et al. | |
| 6,175,161 B1 * | 1/2001 | Goetz et al. | 257/780 |
| 6,177,293 B1 | 1/2001 | Netzer et al. | |
| 6,180,445 B1 | 1/2001 | Tsai | |
| 6,184,143 B1 | 2/2001 | Ohashi | |
| 6,187,615 B1 | 2/2001 | Kim | |
| 6,187,680 B1 | 2/2001 | Costrini | |
| 6,202,299 B1 | 3/2001 | DiStefano et al. | |
| 6,204,091 B1 | 3/2001 | Smith et al. | |
| 6,205,032 B1 | 3/2001 | Shepherd | |
| 6,218,215 B1 | 4/2001 | DiStefano et al. | |
| 6,221,687 B1 | 4/2001 | Abramovich | |
| 6,225,013 B1 | 5/2001 | Cohen et al. | |
| 6,225,692 B1 | 5/2001 | Hinds | |
| 6,228,684 B1 | 5/2001 | Maruyama | |
| 6,228,687 B1 | 5/2001 | Akram et al. | |
| 6,229,203 B1 | 5/2001 | Wojnarowski | |
| 6,232,152 B1 | 5/2001 | DiStefano et al. | |
| 6,235,552 B1 | 5/2001 | Kwon | |
| 6,236,098 B1 | 5/2001 | Efland et al. | |
| 6,236,101 B1 | 5/2001 | Erdeljac | |
| 6,239,482 B1 | 5/2001 | Fillion et al. | |
| 6,239,980 B1 | 5/2001 | Fillion et al. | |
| 6,242,282 B1 | 6/2001 | Fillion et al. | |
| 6,242,987 B1 | 6/2001 | Schopf et al. | |
| 6,245,595 B1 | 6/2001 | Nguyen et al. | |
| 6,255,738 B1 | 7/2001 | DiStefano et al. | |
| 6,258,631 B1 | 7/2001 | Ito et al. | |
| 6,271,469 B1 | 8/2001 | Ma et al. | |
| 6,274,391 B1 | 8/2001 | Wachtler et al. | |
| 6,277,669 B1 | 8/2001 | Kung et al. | |
| 6,278,264 B1 | 8/2001 | Burstein | |
| 6,281,583 B1 | 8/2001 | Dirahoui et al. | |
| 6,284,573 B1 | 9/2001 | Farnworth | |
| 6,285,065 B1 | 9/2001 | Levy | |
| 6,287,893 B1 | 9/2001 | Elenius et al. | |
| 6,288,434 B1 | 9/2001 | Levy | |
| 6,288,447 B1 | 9/2001 | Amishiro | |
| 6,288,905 B1 | 9/2001 | Chung | |
| 6,291,884 B1 | 9/2001 | Glenn et al. | |
| 6,294,040 B1 | 9/2001 | Raab et al. | |
| 6,294,741 B1 | 9/2001 | Cole, Jr. et al. | |
| 6,303,423 B1 | 10/2001 | Lin | |
| 6,309,915 B1 | 10/2001 | DiStefano | |
| 6,313,528 B1 | 11/2001 | Solberg | |
| 6,319,827 B1 | 11/2001 | Kowalski et al. | |
| 6,320,753 B1 | 11/2001 | Launay | |
| 6,323,096 B1 | 11/2001 | Saia et al. | |
| 6,326,697 B1 | 12/2001 | Farnworth | |
| 6,329,224 B1 | 12/2001 | Nguyen et al. | |
| 6,329,713 B1 | 12/2001 | Farquhar et al. | |
| 6,331,481 B1 | 12/2001 | Stamper et al. | |
| 6,333,557 B1 | 12/2001 | Sullivan | |
| 6,344,401 B1 | 2/2002 | Lam | |
| 6,348,728 B1 | 2/2002 | Aiba et al. | |
| 6,356,453 B1 | 3/2002 | Juskey et al. | |
| 6,359,320 B1 | 3/2002 | Yamazaki et al. | |
| 6,359,328 B1 | 3/2002 | Dubin | |
| 6,359,335 B1 | 3/2002 | DiStefano et al. | |
| 6,362,087 B1 | 3/2002 | Wang | |
| 6,362,498 B2 | 3/2002 | Abramovich | |
| 6,365,498 B1 | 4/2002 | Chu | |
| 6,373,141 B1 | 4/2002 | DiStefano et al. | |
| 6,383,858 B1 * | 5/2002 | Gupta et al. | 438/238 |
| 6,383,916 B1 | 5/2002 | Lin | |
| 6,384,473 B1 | 5/2002 | Peterson et al. | |
| 6,388,340 B2 | 5/2002 | DiStefano | |
| 6,395,580 B1 | 5/2002 | Tseng | |
| 6,396,148 B1 * | 5/2002 | Eichelberger et al. | 257/758 |
| 6,400,573 B1 | 6/2002 | Mowatt | |
| 6,423,570 B1 | 7/2002 | Ma et al. | |
| 6,424,034 B1 | 7/2002 | Ahn | |
| 6,428,377 B1 | 8/2002 | Choi | |
| 6,429,036 B1 | 8/2002 | Nixon et al. | |
| 6,429,120 B1 | 8/2002 | Ahn | |
| 6,439,728 B1 | 8/2002 | Copeland | |
| 6,440,834 B2 | 8/2002 | Daubenspeck et al. | |
| 6,441,715 B1 | 8/2002 | Johnson | |
| 6,445,064 B1 | 9/2002 | Ishii et al. | |
| 6,451,418 B1 | 9/2002 | Tobita | |
| 6,458,681 B1 | 10/2002 | DiStefano et al. | |
| 6,459,135 B1 | 10/2002 | Basteres | |
| 6,460,245 B1 | 10/2002 | DiStefano | |
| 6,462,424 B1 | 10/2002 | Seki et al. | |
| 6,472,745 B1 | 10/2002 | Iizuka | |
| 6,482,730 B1 | 11/2002 | Masumoto et al. | |
| 6,486,005 B1 | 11/2002 | Kim | |
| 6,486,535 B2 | 11/2002 | Liu | |
| 6,492,723 B2 | 12/2002 | Suyama | |
| 6,492,829 B1 | 12/2002 | Miura et al. | |
| 6,495,914 B1 | 12/2002 | Sekine et al. | |
| 6,496,240 B1 | 12/2002 | Zhang et al. | |
| 6,501,169 B1 | 12/2002 | Aoki | |
| 6,504,227 B1 | 1/2003 | Matsuo et al. | |
| 6,507,102 B2 | 1/2003 | Juskey et al. | |
| 6,521,996 B1 | 2/2003 | Seshan | |
| 6,537,584 B1 | 3/2003 | Zentner et al. | |
| 6,538,210 B2 | 3/2003 | Sugaya et al. | |
| 6,541,872 B1 | 4/2003 | Schrock et al. | |
| 6,545,354 B1 | 4/2003 | Aoki | |
| 6,546,620 B1 | 4/2003 | Juskey et al. | |
| 6,548,891 B2 | 4/2003 | Mashino | |
| 6,555,469 B1 | 4/2003 | MacIntyre | |
| 6,555,908 B1 | 4/2003 | Eichelberger et al. | |
| 6,558,976 B2 * | 5/2003 | Shrauger | 438/106 |
| 6,559,528 B2 | 5/2003 | Watase | |
| 6,563,106 B1 | 5/2003 | Bowers et al. | |
| 6,582,991 B1 | 6/2003 | Maeda et al. | |
| 6,590,291 B2 | 7/2003 | Akagawa | |
| 6,602,740 B1 | 8/2003 | Mitchell | |
| 6,603,072 B1 | 8/2003 | Foster et al. | |
| 6,610,621 B2 | 8/2003 | Masuko | |
| 6,610,934 B2 | 8/2003 | Yamaguchi et al. | |
| 6,614,091 B1 | 9/2003 | Downey | |
| 6,614,110 B1 | 9/2003 | Pace | |
| 6,617,174 B2 | 9/2003 | Rotstein | |
| 6,620,513 B2 | 9/2003 | Yuyama et al. | |
| 6,625,028 B1 | 9/2003 | Dove et al. | |
| 6,625,037 B2 | 9/2003 | Nakatani et al. | |
| 6,633,005 B2 | 10/2003 | Ichitsubo et al. | |
| 6,639,299 B2 | 10/2003 | Aoki | |

(56) References Cited

U.S. PATENT DOCUMENTS

| | | | |
|---|---|---|---|
| 6,639,324 B1 | 10/2003 | Chien | |
| 6,646,347 B2 | 11/2003 | Mercado et al. | |
| 6,653,172 B2 | 11/2003 | DiStefano et al. | |
| 6,653,563 B2 | 11/2003 | Bohr | |
| 6,657,228 B2 | 12/2003 | Ohtani | |
| 6,657,310 B2 | 12/2003 | Lin | |
| 6,673,698 B1 | 1/2004 | Lin et al. | |
| 6,680,544 B2 | 1/2004 | Lu | |
| 6,683,380 B2 | 1/2004 | Efland | |
| 6,686,015 B2 | 2/2004 | Raab et al. | |
| 6,690,845 B1 | 2/2004 | Yoshimura et al. | |
| 6,707,124 B2 * | 3/2004 | Wachtler et al. | 257/433 |
| 6,710,454 B1 | 3/2004 | Boon | |
| 6,713,589 B2 | 3/2004 | Sue et al. | |
| 6,730,857 B2 | 5/2004 | Konrad et al. | |
| 6,734,534 B1 | 5/2004 | Vu et al. | |
| 6,737,750 B1 | 5/2004 | Hoffman et al. | |
| 6,746,898 B2 | 6/2004 | Lin et al. | |
| 6,759,273 B2 | 7/2004 | Felton et al. | |
| 6,765,299 B2 | 7/2004 | Takahashi et al. | |
| 6,777,819 B2 | 8/2004 | Huang | |
| 6,780,747 B2 | 8/2004 | DiStefano et al. | |
| 6,780,748 B2 | 8/2004 | Yamaguchi | |
| 6,794,273 B2 | 9/2004 | Saito et al. | |
| 6,794,739 B2 | 9/2004 | Kobayashi et al. | |
| 6,797,544 B2 | 9/2004 | Sakai et al. | |
| 6,800,941 B2 | 10/2004 | Lee et al. | |
| 6,806,536 B2 | 10/2004 | Gris | |
| 6,838,750 B2 | 1/2005 | Nuytkens et al. | |
| 6,841,862 B2 | 1/2005 | Kikuchi et al. | |
| 6,847,066 B2 | 1/2005 | Tahara | |
| 6,852,616 B2 | 2/2005 | Sahara | |
| 6,861,740 B2 | 3/2005 | Hsu | |
| 6,867,499 B1 | 3/2005 | Tabrizi | |
| 6,885,107 B2 | 4/2005 | Kinsman | |
| 6,914,331 B2 | 7/2005 | Shimoishizaka | |
| 6,933,601 B2 | 8/2005 | Satoh et al. | |
| 6,943,440 B2 | 9/2005 | Kim | |
| 6,952,049 B1 | 10/2005 | Ogawa et al. | |
| 6,963,136 B2 | 11/2005 | Shinozaki | |
| 6,973,709 B2 | 12/2005 | Huang | |
| 6,975,516 B2 | 12/2005 | Asahi et al. | |
| 6,989,600 B2 | 1/2006 | Kubo et al. | |
| 7,067,926 B2 | 6/2006 | Yamazaki et al. | |
| 7,071,024 B2 | 7/2006 | Towle et al. | |
| 7,087,460 B2 | 8/2006 | Lee | |
| 7,094,630 B2 | 8/2006 | Tomita et al. | |
| 7,115,488 B2 | 10/2006 | Isobe et al. | |
| 7,172,922 B2 | 2/2007 | Benjamin et al. | |
| 7,220,667 B2 | 5/2007 | Yamagata | |
| 7,239,028 B2 | 7/2007 | Anzai | |
| 7,271,033 B2 | 9/2007 | Lin et al. | |
| 7,272,888 B2 | 9/2007 | DiStefano | |
| 7,294,905 B2 | 11/2007 | Ogino et al. | |
| 7,297,614 B2 | 11/2007 | Lee et al. | |
| 7,342,258 B2 | 3/2008 | Yamazaki et al. | |
| 7,345,365 B2 | 3/2008 | Lee et al. | |
| 7,365,273 B2 | 4/2008 | Fairchild et al. | |
| 7,397,117 B2 | 7/2008 | Lin et al. | |
| 7,413,929 B2 | 8/2008 | Lee et al. | |
| 7,417,865 B2 | 8/2008 | Kim | |
| 7,449,412 B2 | 11/2008 | Nuytkens et al. | |
| 7,454,834 B2 | 11/2008 | DiStefano | |
| 7,470,865 B2 | 12/2008 | Fushie et al. | |
| 7,511,376 B2 | 3/2009 | Lin et al. | |
| 7,545,044 B2 | 6/2009 | Shibayama et al. | |
| 7,653,371 B2 | 1/2010 | Floyd | |
| 7,657,242 B2 | 2/2010 | Floyd | |
| 7,678,695 B2 | 3/2010 | Taniguchi et al. | |
| 7,786,002 B2 | 8/2010 | Leib et al. | |
| 7,787,130 B2 | 8/2010 | Webster | |
| 7,830,588 B2 | 11/2010 | Miles | |
| 7,839,356 B2 | 11/2010 | Hagood et al. | |
| 7,848,004 B2 | 12/2010 | Miles | |
| 7,863,524 B2 | 1/2011 | Shioga et al. | |
| 7,881,686 B2 | 2/2011 | Floyd | |
| 7,898,058 B2 | 3/2011 | Lin et al. | |
| 7,977,763 B2 | 7/2011 | Lin et al. | |
| 8,022,551 B2 | 9/2011 | Soga et al. | |
| 8,119,446 B2 | 2/2012 | Lin et al. | |
| 2001/0002064 A1 | 5/2001 | Miyazaki et al. | |
| 2001/0013653 A1 | 8/2001 | Shoji | |
| 2001/0015497 A1 | 8/2001 | Zhao et al. | |
| 2001/0021541 A1 | 9/2001 | Akram et al. | |
| 2001/0026010 A1 | 10/2001 | Horiuchi et al. | |
| 2001/0026435 A1 | 10/2001 | Sakai | |
| 2001/0028098 A1 | 10/2001 | Liou | |
| 2001/0031514 A1 | 10/2001 | Smith | |
| 2001/0033021 A1 | 10/2001 | Shimoishizaka et al. | |
| 2001/0033474 A1 | 10/2001 | Sakai et al. | |
| 2001/0037863 A1 | 11/2001 | Carson et al. | |
| 2001/0040282 A1 | 11/2001 | Corisis et al. | |
| 2001/0042901 A1 | 11/2001 | Maruyama | |
| 2001/0051426 A1 | 12/2001 | Pozder | |
| 2002/0001966 A1 | 1/2002 | Ito et al. | |
| 2002/0004288 A1 | 1/2002 | Nishiyama | |
| 2002/0006718 A1 | 1/2002 | DiStefano | |
| 2002/0007904 A1 | 1/2002 | Raab et al. | |
| 2002/0017730 A1 | 2/2002 | Tahara | |
| 2002/0020898 A1 | 2/2002 | Vu et al. | |
| 2002/0030273 A1 | 3/2002 | Iwamoto et al. | |
| 2002/0063304 A1 | 5/2002 | Toeda et al. | |
| 2002/0070443 A1 | 6/2002 | Mu et al. | |
| 2002/0074641 A1 | 6/2002 | Towle et al. | |
| 2002/0079575 A1 | 6/2002 | Hozoji et al. | |
| 2002/0084510 A1 | 7/2002 | Jun et al. | |
| 2002/0094671 A1 | 7/2002 | DiStefano et al. | |
| 2002/0121689 A1 * | 9/2002 | Honda | 257/700 |
| 2002/0127771 A1 | 9/2002 | Akram et al. | |
| 2002/0133943 A1 | 9/2002 | Sakamoto et al. | |
| 2002/0135063 A1 | 9/2002 | Alcoe et al. | |
| 2002/0137263 A1 | 9/2002 | Towle et al. | |
| 2002/0142521 A1 | 10/2002 | Steffens | |
| 2002/0158334 A1 * | 10/2002 | Vu et al. | 257/723 |
| 2002/0159242 A1 | 10/2002 | Nakatani et al. | |
| 2002/0168797 A1 | 11/2002 | DiStefano et al. | |
| 2002/0180041 A1 | 12/2002 | Sahara et al. | |
| 2002/0184758 A1 | 12/2002 | DiStefano | |
| 2003/0020180 A1 | 1/2003 | Ahn et al. | |
| 2003/0027373 A1 | 2/2003 | DiStefano et al. | |
| 2003/0038331 A1 | 2/2003 | Aoki | |
| 2003/0080437 A1 | 5/2003 | Gonzalez et al. | |
| 2003/0118738 A1 | 6/2003 | Shuy et al. | |
| 2003/0122246 A1 | 7/2003 | Lin et al. | |
| 2003/0134455 A1 | 7/2003 | Cheng et al. | |
| 2003/0201534 A1 | 10/2003 | Eichelberger et al. | |
| 2003/0201548 A1 | 10/2003 | Ikezawa et al. | |
| 2003/0205804 A1 | 11/2003 | Lee et al. | |
| 2003/0218246 A1 | 11/2003 | Abe | |
| 2003/0224613 A1 | 12/2003 | Ramanathan | |
| 2004/0009629 A1 | 1/2004 | Ahn et al. | |
| 2004/0023450 A1 | 2/2004 | Katagiri | |
| 2004/0040740 A1 | 3/2004 | Nakatani et al. | |
| 2004/0063249 A1 | 4/2004 | Lin et al. | |
| 2004/0084741 A1 | 5/2004 | Boon et al. | |
| 2004/0094841 A1 | 5/2004 | Matsuzaki | |
| 2004/0113245 A1 | 6/2004 | Takaoka et al. | |
| 2004/0125579 A1 | 7/2004 | Konishi et al. | |
| 2004/0140559 A1 | 7/2004 | Goller et al. | |
| 2004/0168825 A1 | 9/2004 | Sakamoto et al. | |
| 2005/0070085 A1 | 3/2005 | Huang et al. | |
| 2005/0116322 A1 | 6/2005 | Sando et al. | |
| 2005/0184358 A1 | 8/2005 | Lin | |
| 2005/0208757 A1 | 9/2005 | Lin | |
| 2005/0218515 A1 | 10/2005 | Kweon et al. | |
| 2006/0001152 A1 | 1/2006 | Hu | |
| 2006/0225272 A1 | 10/2006 | DiStefano | |
| 2006/0228272 A1 | 10/2006 | Watson et al. | |
| 2006/0244137 A1 | 11/2006 | Kikuchi et al. | |
| 2011/0205720 A1 | 8/2011 | Lee et al. | |

(56) References Cited

U.S. PATENT DOCUMENTS

| | | | |
|---|---|---|---|
| 2011/0309473 | A1 | 12/2011 | Lin et al. |
| 2013/0309812 | A1 | 11/2013 | Lee et al. |

FOREIGN PATENT DOCUMENTS

| | | |
|---|---|---|
| JP | 05114665 | 5/1993 |
| JP | 09260581 | 10/1997 |
| JP | 2000003985 A | 1/2000 |
| TW | 241438 | 2/1995 |
| TW | 385509 B | 3/2000 |
| TW | 403980 B | 9/2000 |
| TW | 417265 B | 1/2001 |
| TW | 423127 B | 2/2001 |
| TW | 423132 | 2/2001 |
| TW | 444370 B | 7/2001 |
| TW | 449894 B | 8/2001 |
| TW | 452930 | 9/2001 |
| TW | 454318 B | 9/2001 |
| TW | 456006 B | 9/2001 |
| TW | 457662 B | 10/2001 |
| TW | 457830 B | 10/2001 |
| TW | 463274 B | 11/2001 |
| TW | 466652 | 12/2001 |
| TW | 466725 B | 12/2001 |
| TW | 469549 B | 12/2001 |
| TW | 531854 | 5/2003 |
| TW | 90123655 | 5/2003 |

OTHER PUBLICATIONS

Emery, et al. "Novel Microelectronic Packaging Method for Reduced Thermomechanical Stresses on Low Dielectric Constant Materials" Intel Corp., Chandler, AZ.

Tummala R. R., et al., "Microelectronic Packaging Handbook," Van Nostrand Reinhold, vol. Chapter9, 673-725.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High vol. Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions,"Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

"Electronic Materials Handbook, vol. 1—Packaging: Other Design Considerations; Materials and Electronic Phenomena; Physical Characteristics of Microelectronic Materials" ASM International Handbook Committee, pp. 104-111, ASM International (1989).

Kuo, "Semiconductor Packaging Engineering", Zhan Yi-Zheng Publisher, Registration Taipei, Apr. 2000, Table 9.1.

Semiconductor packaging process, Chapter 9, Microstructures and properties of materials, p. 9-5 (1999).

Jacob Millman, Digital and Analog Circuits and Systems, Micro Electronic, Mar. 1979, p. 115 & p. 167, McGraw-Hill College.

Rao R. Tummala, Eugene J.Rymaszewski & Alan G. Klopfenstein, Technology Drivers Part I, Microelectronics Packaging Handbook (Second Edition), Jan. 31, 1997, p. 12~13, p. 64~65, p. 82~87, p. 133, An overview & 8-2 chip-level interconnection evolution, Springer.

John H. Lau & S.W. Ricky Lee, Design Concepts and Package Structure, Chip Scale Package, Feb. 28, 1999, p. 157~161, Chapter 10.2, McGraw-Hill Professional.

(56) References Cited

OTHER PUBLICATIONS

U.S. Appl. No. 10/055,568, filed Jan. 22, 2002, Mitchell, James M, RCE filed Apr. 24, 2012.

U.S. Appl. No. 10/174,462, filed Jun. 17, 2002, Chambliss, Alonzo, Issued as Patent No. 6,746,898.

U.S. Appl. No. 10/755,042, filed Jan. 9, 2004, Jackson Jr., Jerome, Final OA mailed Mar. 15, 2012.

John H.L., et al., "Chip Scale Package, General Electric's Chip-On-Flex Chip Scale Package (COFCSP)", Feb. 28, 1999, pp. 156-161, Chapter ten, McGraw-Hill Professional.

\* cited by examiner

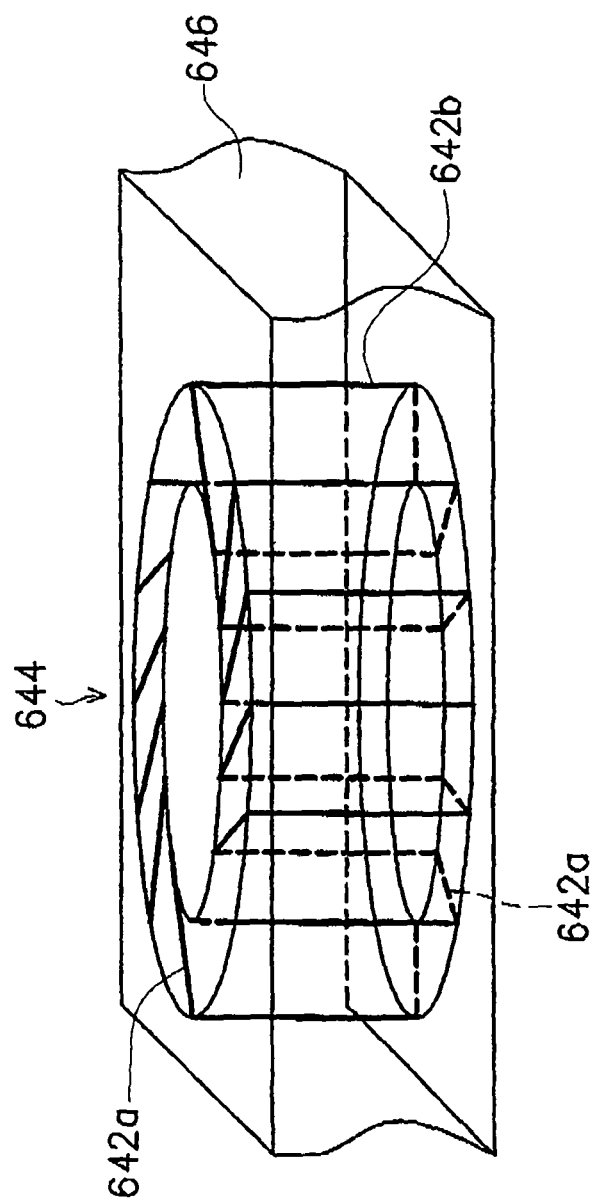

INTEGRATED CHIP PACKAGE STRUCTURE USING SILICON SUBSTRATE AND METHOD OF MANUFACTURING THE SAME

This application is a divisional application of, and claims the priority benefit of, U.S. application Ser. No. 10/055,568 filed on Jan. 22, 2002.

CROSS-REFERENCE TO RELATED APPLICATION

This application claims the priority benefit of Taiwan application serial no. 90133195, filed Dec. 31, 2001.

BACKGROUND OF THE INVENTION

1. Field of the Invention

The present invention relates to an integrated chip package structure and method of manufacture the same. More particularly, the present invention relates to an integrated chip package structure and method of manufacture the same using silicon substrate.

2. Description of Related Art

In the recent years, the development of advanced technology is on the cutting edge. As a result, high-technology electronics manufacturing industries launch more feature-packed and humanized electronic products. These new products that hit the showroom are lighter, thinner, and smaller in design. In the manufacturing of these electronic products, the key device has to be the integrated circuit (IC) chip inside any electronic product.

The operability, performance, and life of an IC chip are greatly affected by its circuit design, wafer manufacturing, and chip packaging. For this present invention, the focus will be on chip packaging technique. Since the features and speed of IC chips are increasing rapidly, the need for increasing the conductivity of the circuitry is necessary so that the signal delay and attenuation of the dies to the external circuitry are reduced. A chip package that allows good thermal dissipation and protection of the IC chips with a small overall dimension of the package is also necessary for higher performance chips. These are the goals to be achieved in chip packaging.

There are a vast variety of existing chip package techniques such as ball grid array (BGA), wire bonding, flip chip, etc. . . for mounting a die on a substrate via the bonding points on both the die and the substrate. The inner traces helps to fan out the bonding points on the bottom of the substrate. The solder balls are separately planted on the bonding points for acting as an interface for the die to electrically connect to the external circuitry. Similarly, pin grid array (PGA) is very much like BGA, which replaces the balls with pins on the substrate and PGA also acts an interface for the die to electrically connect to the external circuitry.

Both BGA and PGA packages require wiring or flip chip for mounting the die on the substrate. The inner traces in the substrate fan out the bonding points on the substrate and electrical connection to the external circuitry is carried out by the solder balls or pins on the bonding points. As a result, this method fails to reduce the distance of the signal transmission path but in fact increase the signal path distance. This will increase signal delay and attenuation and decrease the performance of the chip.

Wafer level chip scale package (WLCSP) has an advantage of being able to print the redistribution circuit directly on the die by using the peripheral area of the die as the bonding points. It is achieved by redistributing an area array on the surface of the die, which can fully utilize the entire area of the die. The bonding points are located on the redistribution circuit by forming flip chip bumps so the bottom side of the die connects directly to the printed circuit board (PCB) with micro-spaced bonding points.

Although WLCSP can greatly reduce the signal path distance, it is still very difficult to accommodate all the bonding points on the die surface as the integration of die and internal devices gets higher. The pin count on the die increases as integration gets higher so the redistribution of pins in an area array is difficult to achieve. Even if the redistribution of pins is successful, the distance between pins will be too small to meet the pitch of a printed circuit board (PCB).

SUMMARY OF THE INVENTION

Therefore the present invention provides an integrated chip package structure and method of manufacturing the same that uses the original bonding points of the die and connect them to an external circuitry of a thin-film circuit layer to achieve redistribution. The spacing between the redistributed bonding points matches the pitch of aPCB.

In order to achieve the above object, the present invention presents a chip package structure and method of manufacturing the same by adhering the backside of a die to a silicon substrate, wherein the active surface of the die has a plurality of metal pads. A thin-film circuit layer is formed on top of the die and the silicon substrate, where the thin-film circuit layer has an external circuitry that is electrically connected to the metal pads of the die. The external circuitry extends to a region that is outside the active area of the dies and has a plurality of bonding pads located on the surface layer of the thin-film layer circuit. The active surface of the die has an internal circuitry and a plurality of active devices, where signals can be transmitted from one active device to the external circuitry via the internal circuitry, then from the external circuitry back to another active device via the internal circuitry. Furthermore, the silicon substrate has at least one inwardly protruded area so the backside of the die can be adhered inside the inwardly protruded area and exposing the active surface of the die. Wherein the silicon substrate is composed of a silicon layer and a heat insulating material formed overlapping and the inwardly protruded areas are formed by overlapping the silicon substrate with openings on the heat conducting layer. Futhermore, the present chip package structure allows multiple dies with same or different functions to be packaged into one integrated chip package and permits electrically connection between the dies by the external circuitry.

It is to be understood that both the foregoing general description and the following detailed description are exemplary, and are intended to provide further explanation of the invention as claimed.

BRIEF DESCRIPTIOIN OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1I are schematic diagrams showing the sectional view of the structure of the first embodiment of the present invention.

FIG. 11C is a schematic diagram of the formation of a passive device by a double layer of patterned wiring layer of the thin-film circuit layer.

DETAILED DESCRIPTION OF THE PREFERRED EMBODIMENTS

Figure 1A:
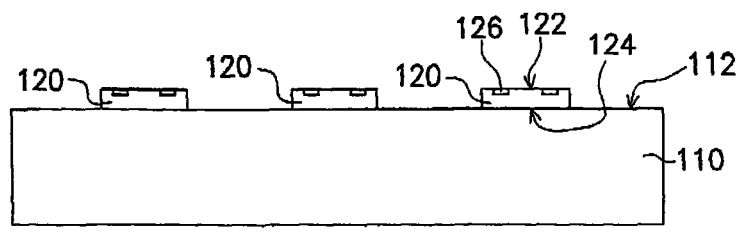

Please refer to FIG. 1A, a silicon substrate 110 with a surface 112 and a plurality of dies 120 are provided. Dies 120 have an active surface 122 and a backside 124 is also provided, where the active devices are formed on active surface 122 of the dies. Furthermore, dies 120 have a plurality of metal pads 126 located on active surface 122 of dies 120 acting as the output terminal of dies 120 to transmit signals to the external circuitry. Backside 124 of dies 120 is adhered to surface 112 of silicon substrate 110 by a conductive paste or adhesive tape. Therefore, active surface 122 of dies 120 is facing upwards along surface 112 of silicon substrate 110.

Figure 1B:
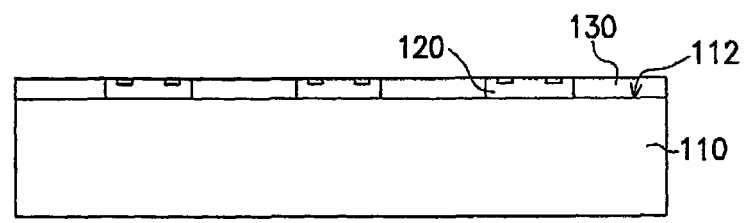

Please refer to FIG. 1B, when adhering die 120 to silicon substrate 110, a filling layer 130 can be formed on top of surface 112 of silicon substrate 100 surrounding the peripheral of dies 120 to fill the gap between dies 120. The height of filling layer 130 should be approximately equal to the height of active surface 122 of dies 120. The material of filling layer 130 can be epoxy, polymer, or the like. After curing of filling layer 130, a grinding or etching process is applied to planarize filling layer 130 so the top face of filling layer 130 is planar with active surface 122 of dies 120.

Figure 1C:
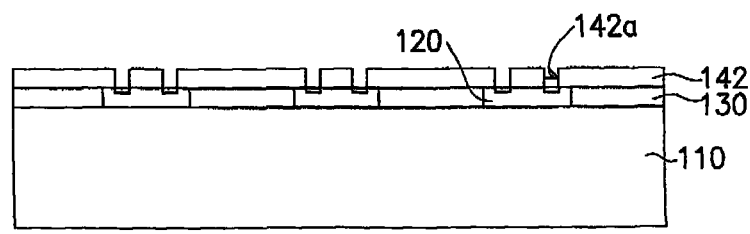

Please refer to FIG. 1C, after the formation of filling layer 130 on silicon substrate 110, a dielectric layer 142 is deposited on top of filling layer 130 and active surface 122 of dies 120. Dielectric layer 142 is patterned according to metal pads 126 on dies 120 to form thru-holes 142a. The material of dielectric layer 142 can be poly-Imide (PI), benzocyclobutene (BCB), porous dielectric material, stress buffer material, or the like. Patternization of dielectric layer 142 can be performed by photo via, laser ablation, plasma etching, or the like.

Please continue to refer to FIG. 1C, filling layer 130 is used to support dielectric layer 142 so dielectric layer 142 can be formed planarized on top of silicon substrate 110 and dies 120 without an uneven surface. As a result, after dielectric layer 142 is formed on surface 112 of silicon substrate 110 and active surface 122 of dies 120, dielectric layer 142 also fills the peripheral of dies 120, meaning the gap between dies 120. Therefore the bottom structure of dielectric layer 142 can replace the structure of filling layer 130 covering entirely surface 112 of silicon substrate 110 and surrounding dies 120. The method of forming dielectric layer 142 includes first depositing a layer of dielectric layer 142 entirely over dies 120 and silicon substrate 110, then after curing, a grinding or etching process is performed to planarize dielectric layer 142.

Figure 1D:
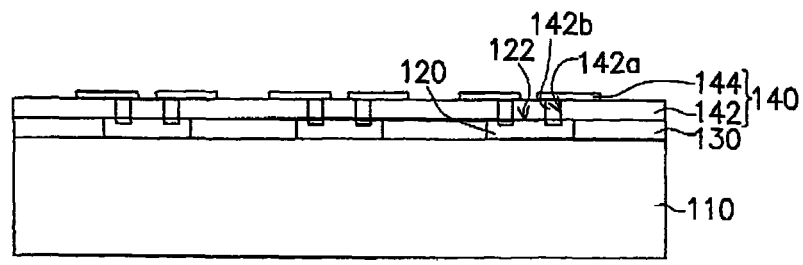

Please refer to FIG. 1D, after forming dielectric layer 142 and patterning dielectric layer 142 to form thru-holes 142a, a patterned wiring layer 144 is formed by photolithography and sputtering, electroplating, or electro-less plating. Wherein part of the conductive material from patterned wiring layer 144 will be injected into thru-holes 142a to form vias 142b, copper (Cu) is used as the material for patterned wiring layer 144. Moreover, thru-holes 142a can be pre-filled with a conductive material such as a conductive glue to form vias 142b. Therefore no matter if the thru-holes are filled with the conductive material from patterned wiring layer 144 or pre-filled with a conductive material, patterned wiring layer 144 is electrically connected to metal pads 126 of dies 120. It is to be noted that part of patterned wiring layer 144 extends to a region outside active surface 122 of dies 120. Dielectric layer 142 and patterned wiring layer 144 form a thin-film circuit layer 140.

Figure 1E:
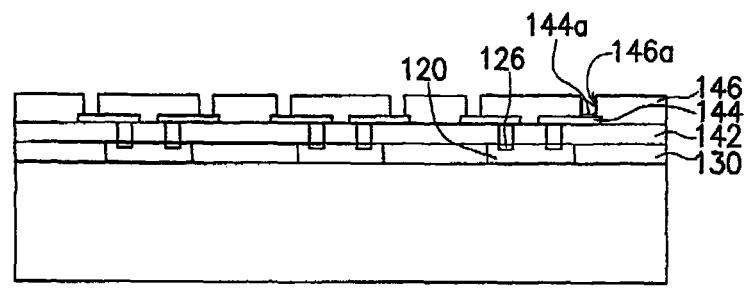

Please refer to FIG. 1E, after the formation of patterned wiring layer 144, another dielectric layer 146 can be formed similarly to dielectric layer 142 on top of dielectric layer 142 and patterned wiring layer 144. Dielectric layer 146 is also patterned to form thru-holes 146a, whereas thru-holes 146a correspond to bonding pads 144a of patterned wiring layer 144.

Figure 1F:
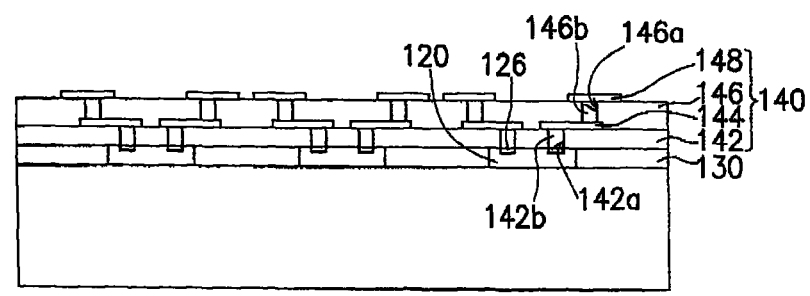

Please refer to FIG. 1F, after the formation and patternization of dielectric layer 146 to form thru-holes 146a, a patterned wiring layer 148 can be formed on dielectric layer 146 in a similar way as patterned wiring layer 144. Wherein part of the conductive material from patterned wiring layer 148 will be injected into thru-hole 146a forming a via 146b. By the same token, patterned wiring layer 148 is electrically connected to patterned wiring layer 144 by vias 146b, and further electrically connected to metal pads 126 of die 120 by vias 142b of thru-hole 142a. Therefore, thin-film circuit layer 140 further comprises dielectric layer 146, a plurality of vias 146b, and patterned wiring layer 148.

Please continue to refer to FIG. 1F, in order to redistribute all metal pads 126 of dies 120 on silicon substrate 110, the number of patterned wiring layers (144, 148 . . . ) and dielectric layers (142, 146 . . . ) for electrical insulation may be increased. All patterned wiring layers (144, 148 . . . ) are electrically connected by vias (146b . . . ) of thru-holes (146a . . . ). However if only the first patterned wiring layer 144 is required to entirely redistribute metal pads 126 of dies 120 on silicon substrate 110, extra dielectric layers (146 . . . ) and patterned wiring layers (148 . . . ) will no longer be required in the structure. In other words, thin-film circuit layer 140 comprises at least one dielectric layer 142, one patterned wiring layer 144, and a plurality of vias 142b.

Wherein patterned wiring layer (144, 148 . . . ) and vias (142b, 146b . . . ) of thin-film circuit layer 140 form an external circuitry of thin-film circuit layer 140.

Figure 1G:
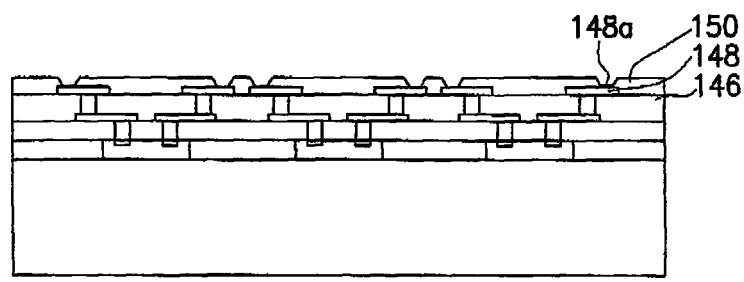

Please refer to FIG. 1G, after the formation of patterned wiring layer 148, a patterned passivation layer 150 is formed on top of dielectric layer 146 and patterned wiring layer 148. Patterned passivation layer 150 is used to protect patterned wiring layer 148 and expose the plurality of bonding pads 148a of patterned wiring layer 148, whereas some of bonding pads 148a are in a region outside of active surface 122 of dies 120. As previously mentioned, the redistribution of metal pads 126 on silicon substrate 110 requires multiple layers of patterned wiring layers (144, 148 . . . ) and a patterned passivation layer 150 formed on the very top, which is furthest away from silicon substrate 110. However, if only patterned wiring layer 144 is required to redistribute metal pads 126 of dies 120 on silicon substrate 110, patterned passivation layer 150 will be formed directly on patterned wiring layer 144. The material of passivation layer 150 can be anti-solder insulating coating or other insulating material.

Figure 1H:
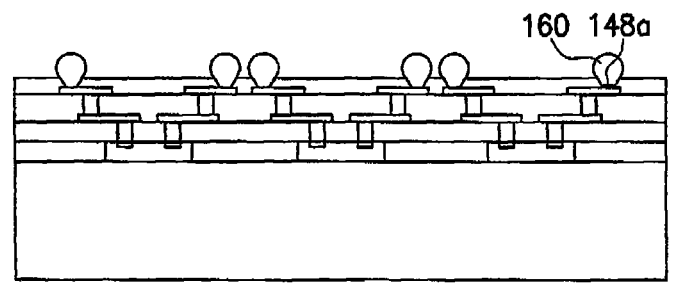

Please refer to FIG. 1H, after the formation of patterned passivation layer 150, a bonding point 160 can be placed on bonding pads 148a serving as an interface for electrically connecting die 120 to the external circuitry. Wherein bonding point 160 illustrated in FIG. 1H is a ball but it is not limited to any formation, which might include a bump, pin, or the like. Ball connector maybe solder ball, and bump connector maybe solder bump, gold bump, or the like.

Figure 1I:
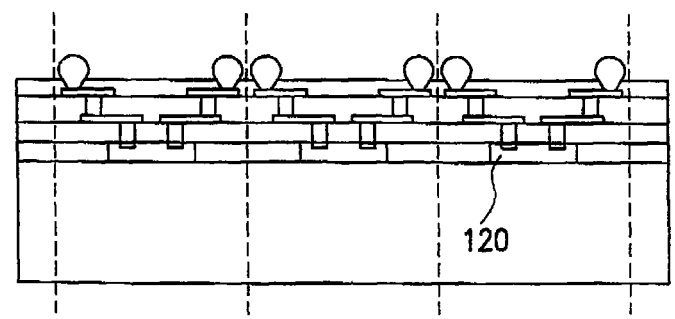

Please refer to FIG. 1I, after the formation of bonding points 160 on bonding pads 148a, a singularization process of packaged die 120 by mechanical or laser cutting is performed along the dotted line as indicated in the diagram. Afterwards, the chip package structure of the die is completed.

According to the above, the first embodiment of the present invention is a chip package structure with a silicon substrate and a plurality of dies on it. The external circuitry of the thin-film circuit layer allows the metal pads of the die to fan out. By forming bonding pads corresponding to the metal pads of the dies such as solders balls, bumps, or pins as the signal input terminals, the distance of the signal path is effectively decreased. As a result, signal delay and attenuation is reduced to increase performance of the die.

Furthermore, the fabrication process of semi-conductor includes forming active devices and internal circuitry on the surface of a silicon wafer and singularizing the wafer for individual chips. Therefore the main substance in a chip is silicon. The present invention provides a silicon substrate as the chip package structure to package the chip after adhesion to the silicon substrate. The coefficient of thermal expansion (CTE) of the chip and the silicon substrate is identical which can reduce thermal stress between the chips and the silicon substrate at high operating temperature of the chips. As a result, the life span and durability of the chips after packaging is increased because the metal traces of the chip and silicon substrate will not be stretched.

Figure 2A:
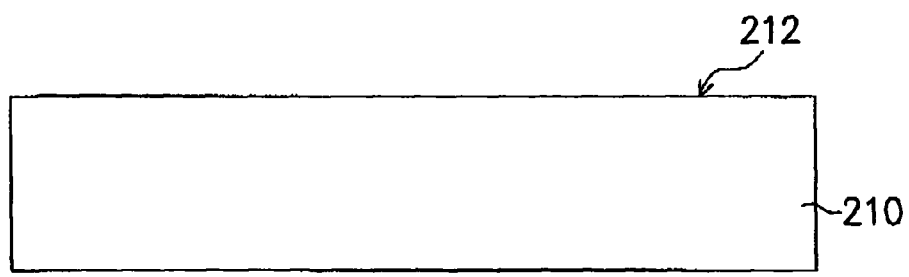
FIGS. 2A to 2C are schematic diagrams showing the sectional view of the structure of the second embodiment of the present invention.
Figure 2B:
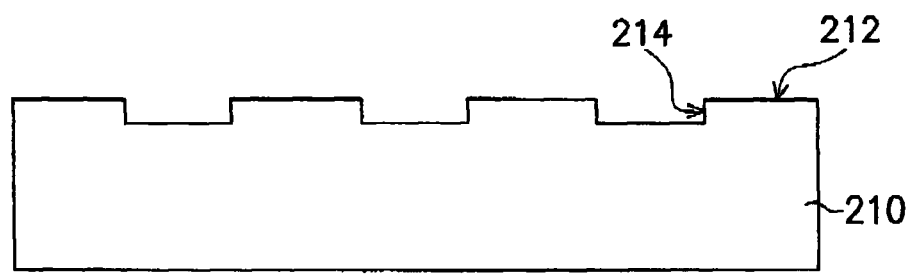
Figure 2C:
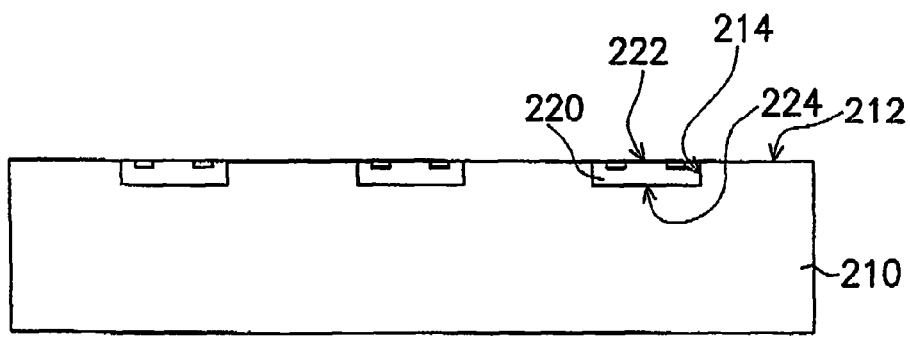

The second embodiment of the present invention differs from the first embodiment by having inwardly protruded areas in the silicon substrate. This area is for placement of the die with the backside of the die adhered against the bottom of the area so the overall thickness of the chip package structure is reduced. FIGS. 2A to 2C are schematic diagrams of the sectional view of the second embodiment illustrating the fabrication of the structure.

Please refer to FIG. 2A, a silicon substrate 210 with a surface 212 is provided. In FIG. 2B, multiple inwardly protruded areas 214 on surface 212 of silicon substrate 210 are formed by removing part of silicon substrate 210. The method of forming inwardly protruded areas 214 includes wet etching at a controlled rate so the depth of each inwardly protruded area 214 is approximately equal to that of die 220. Therefore the outline and depth of inwardly protruded areas 214 will be the same as dies 220 in FIG. 2C. The rate of etching can be increased by using KOH, which has a higher corrosiveness on silicon, to improve the speed of the fabrication process. Alternatively, the inwardly protruded areas 214 on silicon substrate 210 can be formed by machining such as milling. In FIG. 2C, backside 224 of dies 220 is adhered to the bottom of inwardly protruded areas 214 so dies 220 are inlayed in inwardly protruded areas 214. Active surface 222 of die 220 is exposed along surface 212 or silicon substrate 210.

The structure of the second embodiment of the present invention after FIG. 2C will follow FIGS. 1C to 1I from the first embodiment of the present invention, therefore it will not be repeated.

The second embodiment of the present invention is a silicon substrate with a plurality of inwardly protruded areas for inlaying dies by adhering the backside of the dies to the bottom of the inwardly protruded areas and exposing the active surface of the dies. A thin-film circuit layer is formed on top of the dies and the silicon substrate to fan out the metal pads of the dies by using the external circuitry of the thin-film circuit layer. Due to the inlay of the dies in the silicon substrate, thinning of the thickness of the chip package structure is effectively achieved and the surface of the silicon substrate provides enough planarity and support for the formation of the thin-film circuit layer.

Figure 3A:
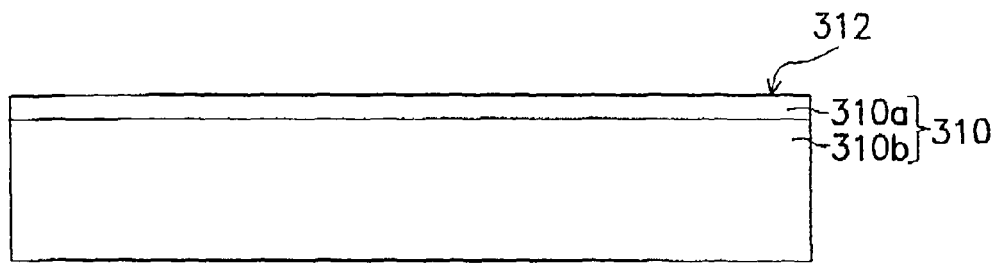
FIGS. 3A to 3C are schematic diagrams showing the sectional view of the structure of the third embodiment of the present invention.
Figure 3B:
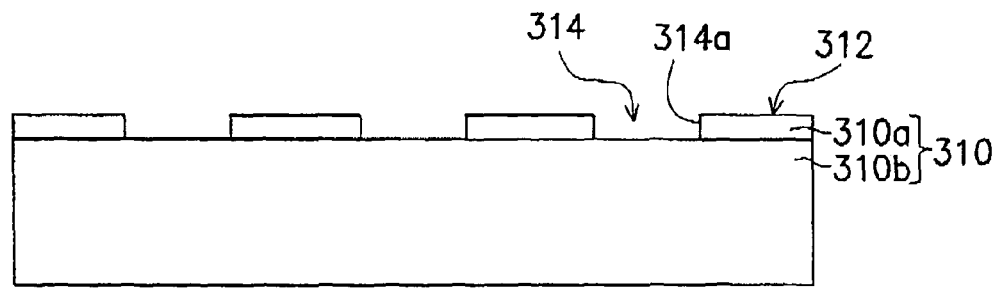
Figure 3C:
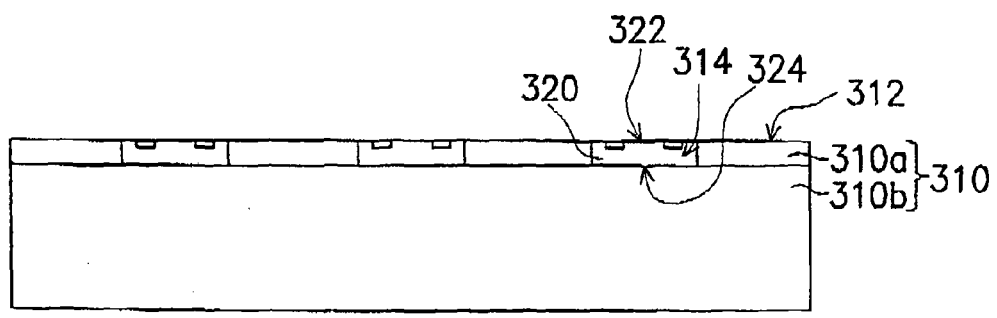

The third embodiment of the present invention differs from the second embodiment of the present invention by using an integrated silicon substrate with at least one silicon layer and one heat conducting layer. FIGS. 3A to 3C are schematic diagrams of the sectional view of the third embodiment illustrating the fabrication of the structure.

Please refer to FIG. 3A, an integrated silicon substrate 310 consists of a silicon layer 310a with multiple openings 314a and a heat conducting layer 310b, wherein the material of heat conducting layer 310b maybe metal. In FIG. 3B, part of silicon layer 310a is removed and placed overlapping heat conducting layer 310b so openings 314a of silicon layer 310a form inwardly protruded areas 314, wherein silicon layer 310a is wet etched downwards until reaching the surface of heat conducting layer 310b. Following in FIG. 3C, backside 324 of die 320 is adhered to the bottom of inwardly protruded areas 314 so dies 320 are inlayed in silicon substrate 310 with active surface 322 of die 320 exposed along surface 312 of silicon substrate 310.

The structure of the third embodiment of the present invention after FIG. 3C will follow FIGS. 1C to 1I from the first embodiment of the present invention, therefore it will not be repeated.

The third embodiment of the present invention is an integrated silicon substrate with a silicon layer with a plurality of openings and a heat conducting layer, wherein the openings are formed by etching. The openings on the silicon layer will form inwardly protruded areas on the integrated silicon substrate. The backside of the die adheres to the bottom of the inwardly protruded areas so the dies are inlayed in the inwardly protruded areas exposing the active surface of the dies.

As mentioned above, this integrated silicon substrate can efficiently dissipate heat from the dies to the outside because the bottom of the inwardly protruded area is the surface of the heat conducting material. The surface of the silicon substrate provides enough planarity and support for the formation of the thin-film circuit layer. Moreover, the CTE of the chips and substrate is identical so thermal stress between the chips and the silicon substrate is greatly reduced because the metal traces on the chips are not stretched to increase the life span and durability of the chips.

The fourth embodiment of the present invention is slightly different from the first three embodiments. FIGS. 4A to 4E are schematic diagrams of the sectional view of the fourth embodiment illustrating the fabrication of the structure.

Figure 4A:
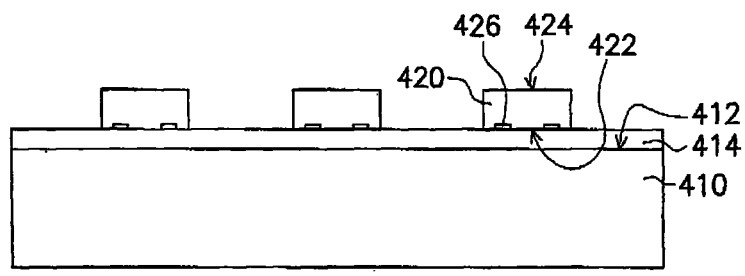
FIGS. 4A to 4I are schematic diagrams showing the sectional view of the structure of the forth embodiment of the present invention.

Please refer to FIG. 4A, a silicon substrate 410 with a first surface 412 and an insulating layer 414 of material such as metal nitride or metal oxide formed on top of first surface 412 of silicon substrate 410. The thickness of insulating layer 414 is about 2 microns to 200 microns, usually 20 microns. Following, a plurality of dies 420 having an active surface 422, a backside 424, and a plurality of metal pads 426 located on active surface 422 is provided. The fourth embodiment of the present invention differs from the third embodiment of the present invention by placing active surface 422 of die 420 downwards facing first surface 412 of silicon substrate 410.

Figure 4B:
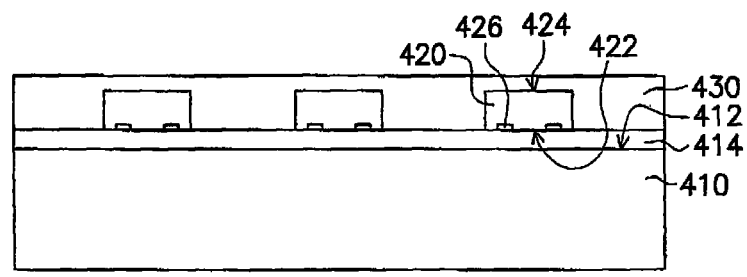

Please refer to FIG. 4B, a filling layer 430 is formed on top of insulating layer 414 after active surface 422 of die 420 is adhered to first surface 412 of silicon substrate 410. Filling layer 430 covers entirely first surface 412 of silicon substrate 410 and surrounds dies 420. The material of filling layer 430 maybe an oxide, epoxy, or the like.

Figure 4C:
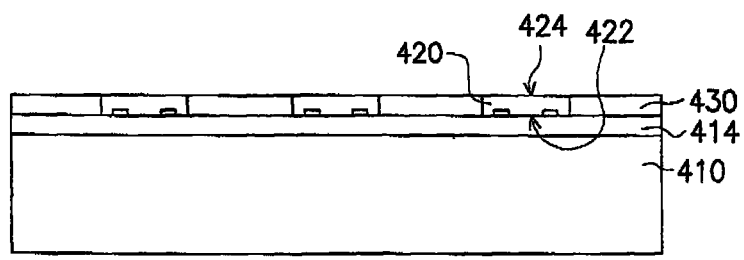

Please refer to FIG. 4C, after the formation of filling layer 430, a planarization process such as chemical mechanical polishing (CMP) is performed to planarize filling layer 430 and backside of die 420. Although the thickness of the active devices and wiring (not shown) on active surface 422 of die 420 is much less than that of die 420, the thickness of die 420 should not be too small because cracks or damage to the die will occur during machine handling (for example vacuum suction). However the present invention directly adheres active surface 422 of die 420 on first surface 412 of silicon substrate 410 without further machine handling. Afterwards a CMP process is performed on backside 424 of dies 420 to reduce the thickness of dies 420. As a result, dies 420 are ground to a very small thickness allowing the final chip package structure to be much thinner.

Figure 4D:
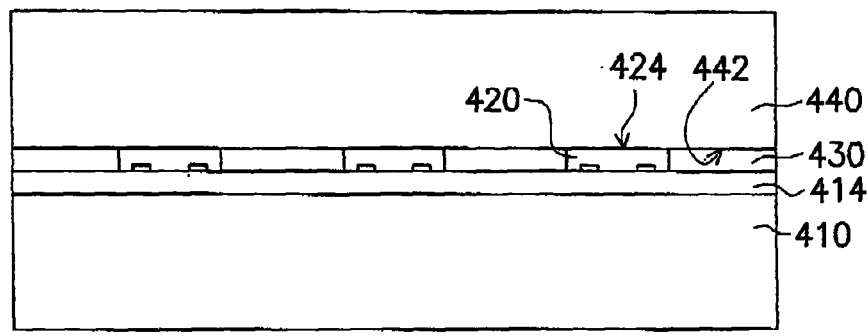

Please refer to FIG. 4D, after the planarization of filling layer 430 and dies 420, a second silicon substrate 440 with a second surface 442 is adhered to filling layer 430 and dies 420 creating a sandwich effect with filling layer 430 and dies 420 in between two silicon substrates 410 and 440.

Figure 4E:
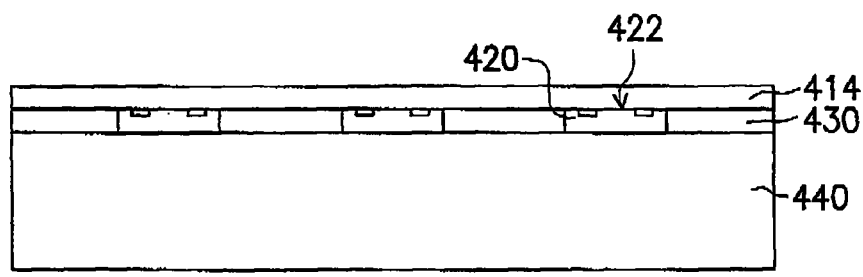

Please refer to FIG. 4E, after the adhesion of second silicon substrate 440, first silicon substrate 410 is removed by etching until reaching insulating 414 and preserving insulating layer 414 on top of dies 410 and filling layer 430. First silicon substrate is used to provide a planar surface (surface 412 in FIG. 4A) for the adhesion and formation of insulating layer 414. Therefore first silicon substrate can be replaced by substrate of other material such as glass, ceramic, metal, or other organic material.

Figure 4F:
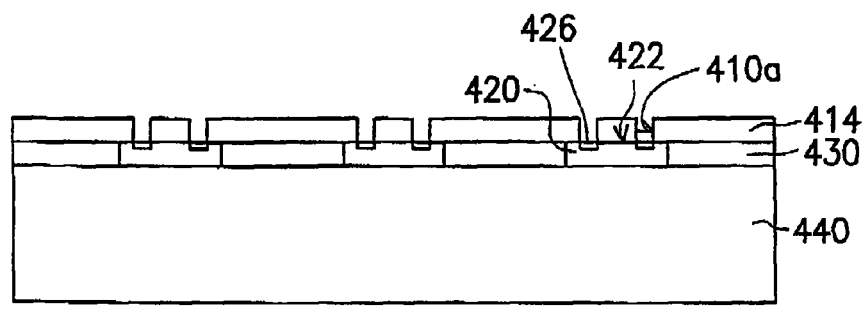

Please refer to FIG. 4F, after the thinning of first silicon substrate 410, a plurality of first thru-holes 410a are formed on insulating layer 414 for exposing metal pads 426 of active surface 422 of die 420. First thru-holes 410a can be formed by machine drilling, laser, plasma etching, or similar methods.

Figure 4G:
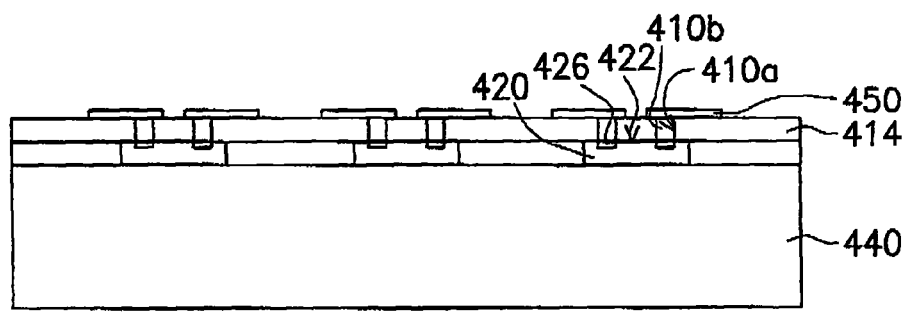

Please refer to FIG. 4G, a first patterned wiring layer 450 is formed on insulating layer 414. Using the same method disclosed in the first embodiment of the present invention, first vias 410b in first thru-holes 410a are formed by either filling first thru-holes 410a with part of the conductive material from patterned wiring layer 450 or pre-filling first thru-holes 410a with a conductive material before the formation of patterned wiring layer 450. A part of patterned wiring layer 450 will extend to a region outside active surface 422 of die 420.

Figure 4H:
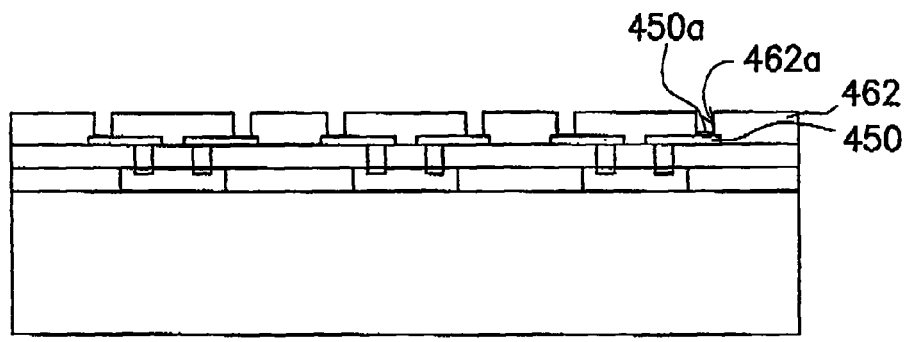

Please refer to FIG. 4H, a dielectric layer 462 is formed on insulating layer 414 and first patterned wiring layer 450. Wherein dielectric layer 462 is patterned to form a plurality of second thru-holes 462a, which correspond to bonding pad 450a of patterned wiring layer 450.

Figure 4I:
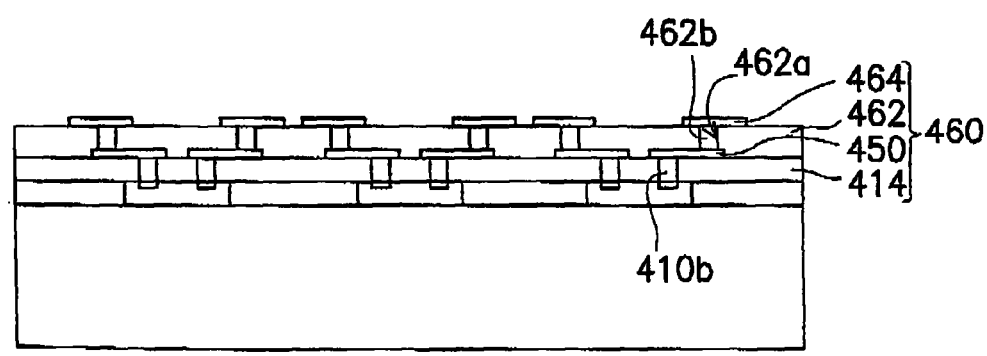

Please refer to FIG. 4I, a second patterned wiring layer 464 is formed on dielectric layer 462. Using the same method as above, second vias 462b in second thru-holes 462a can be formed by either filling second thru-holes 462a with part of the conductive material from patterned wiring layer or pre-fill second thru-holes 462a with a conductive material before the formation of patterned wiring layer 464. Similarly, in order to redistribute metal pads 426 of dies 420 on second silicon substrate 440, dielectric layer (462 . . . ), second vias (462a . . . ), and second patterned wiring layer (464 . . . ) can be repeatedly formed on dies 420 and silicon substrate 440. Wherein insulating layer 414, first patterned wiring layer 450, dielectric layer 462 . . . , and second patterned wiring layer 464 . . . form thin-film circuit layer 460. First vias 410b, first patterned wiring layer 450, second vias 462b . . . , and second patterned wiring layer 464 form the external circuitry of thin-film circuit layer 460.

The structure of the fourth embodiment of the present invention after FIG. 4I will follow FIGS. 1G to 1I from the first embodiment of the present invention, therefore it will not be repeated.

The fourth embodiment of the present invention is a silicon substrate with the active surface of the dies directly adhered to the insulating layer of the first silicon substrate. A filling layer is formed over the dies and the silicon substrate followed by a planarization and thinning process. Afterwards, a second silicon substrate is adhered to the die and the filling layer. A plurality of thru-holes filled with conductive material are formed on the insulating layer. Finally, a patterned wiring layer is formed on the insulating layer allowing the external circuitry of the thin-film circuit layer to extend to a region outside the active surface of the die to help fan out the metal pads of the die.

The advantage of this structure is increased surface stability and accuracy because the active surface of the dies are first adhered to the surface of the first silicon substrate. The thickness of the die can be very small for reducing the overall thickness of the chip package because no machines handling of dies is required.

The fifth embodiment of the present invention takes the first half of the fabrication process from the fourth embodiment of the present invention and combines with the second half of the fabrication process from the first embodiment of the present invention. FIGS. 5A to 5E are schematic diagrams of the sectional view illustrating the fabrication of the structure.

Figure 5A:
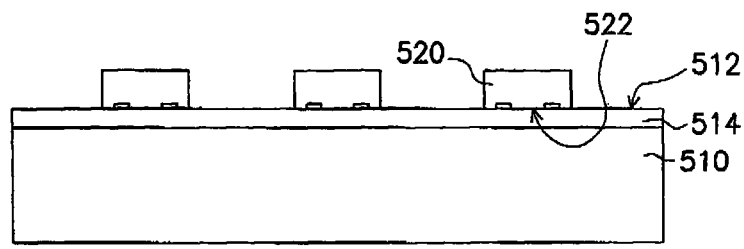
FIGS. 5A to 5E are schematic diagrams showing the sectional view of the structure of the fifth embodiment of the present invention.
Figure 5B:
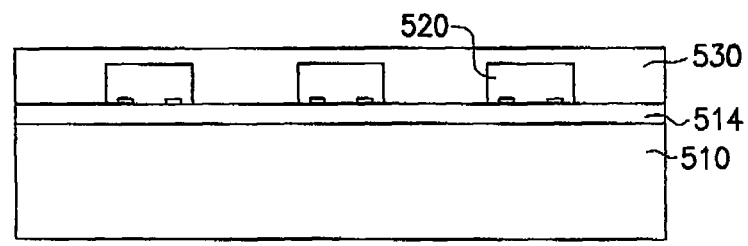

Please refer to FIG. 5A, an insulating layer 514 is formed on top of first surface 512 of silicon substrate 510. Following, an active surface 522 of dies 520 is adhered to a first surface 512 of insulating layer 514. Wherein the material of insulating 514 includes metal nitride or metal oxide. In FIG. 5B, a filling layer 530 is formed on top of dies 520 and insulating layer 514 covering dies 520.

Figure 5C:
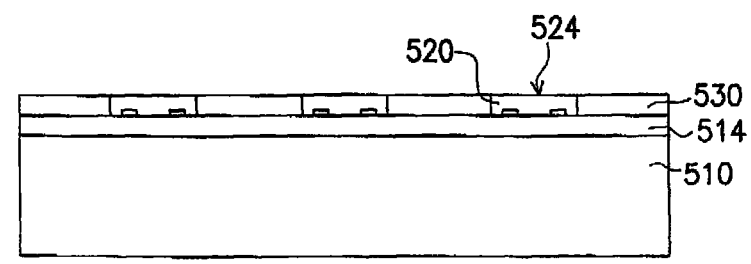
Figure 5D:
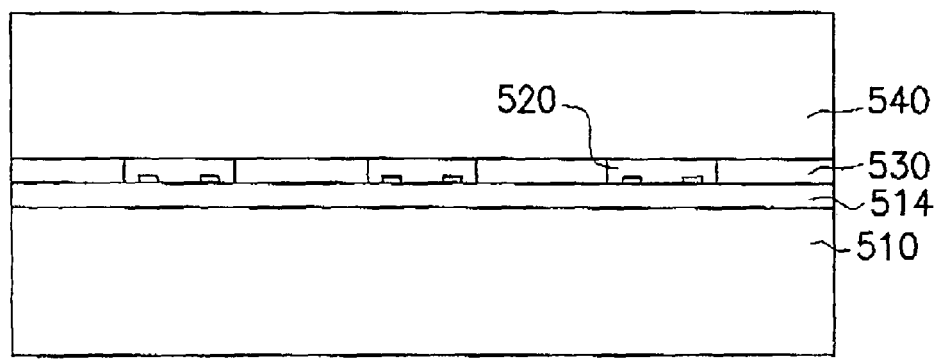

In FIG. 5C, a planarization and thinning process of dies 520 and filling layer 530 is performed to planarize backside 524 of dies 520 and filling layer 530. In FIG. 5D, a second silicon substrate 540 is formed on top of dies 520 and filling layer 530 so backside 524 of dies 520 adheres to second silicon substrate 540. By removing filling layer 530, first silicon substrate 510, and insulating layer 514, the metal pads on active surface 522 of dies 520 are exposed, as illustrated in FIG. 5E.

First silicon substrate 510 and is used to supply a planarized surface (first surface 512), and will be removed in later stages of the fabrication process. Therefore first silicon substrate 510 can be replaced by substrates of other materials such as glass, metal, silicon, metal, or other organic material. Similarly, insulating layer 514 of first silicon substrate is also removed in later stages of the fabrication process. Therefore it is not necessary to form insulating layer 414 on top of first silicon substrate 510 and directly adheres active surface 522 of dies 520 to first surface 512 of first silicon substrate 510.

Figure 5E:
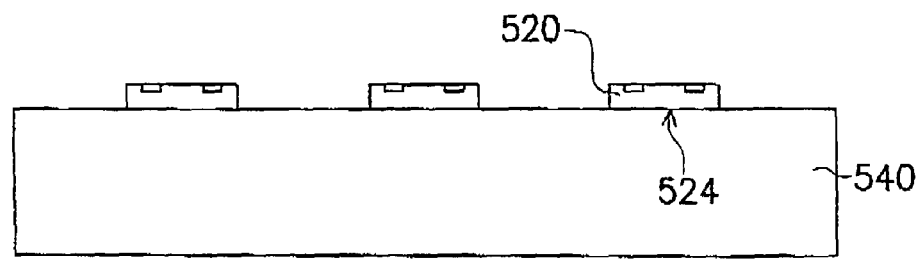

The structure of the fifth embodiment of the present invention after FIG. 5E will follow FIGS. 1B to 11 of the first embodiment of the present invention, therefore it will not be repeated.

The fifth embodiment of the present invention is a silicon substrate with the active surface of the die adhered to the insulating layer of the first silicon substrate for allowing high surface stability and accuracy. As a result, it eliminates the need of machine handling of the dies to achieve a very small thickness of the die for reducing the overall thickness of the chip package.

Figure 6:
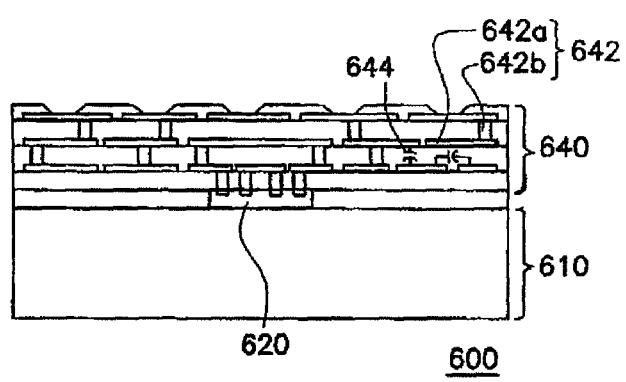
FIG. 6 is a schematic diagram showing the sectional view of the chip package structure of a preferred embodiment of the present invention with one die.

Furthermore, please refer to FIG. 6, it illustrates the schematic diagram of the sectional view of the chip package structure 600 of the present invention for a single die 620. Die 620 is placed on silicon substrate 610, and a thin-film circuit layer 640 is formed on top of die 620 and silicon substrate 610. External circuitry 642 of thin-film circuit layer 640 has at least has one patterned wiring layer 642a and a plurality of vias 642b. The thickness of the inner traces inside die 620 is usually under 1 micron, but because the high amount of traces collocated together so RC delay is relatively high and the power/ground bus requires a large area. As a result, the area of die 620 is not enough to accommodate the power/ground bus. Therefore the chip package structure 600 uses thin-film circuit layer 640 and external circuitry 642 with wider, thicker, and longer traces to alleviate the problem. These traces act an interface for transmitting signals for the internal circuitry of die 620 or the power/ground bus of die 620. This will improve the performance of die 620.

Figure 8:
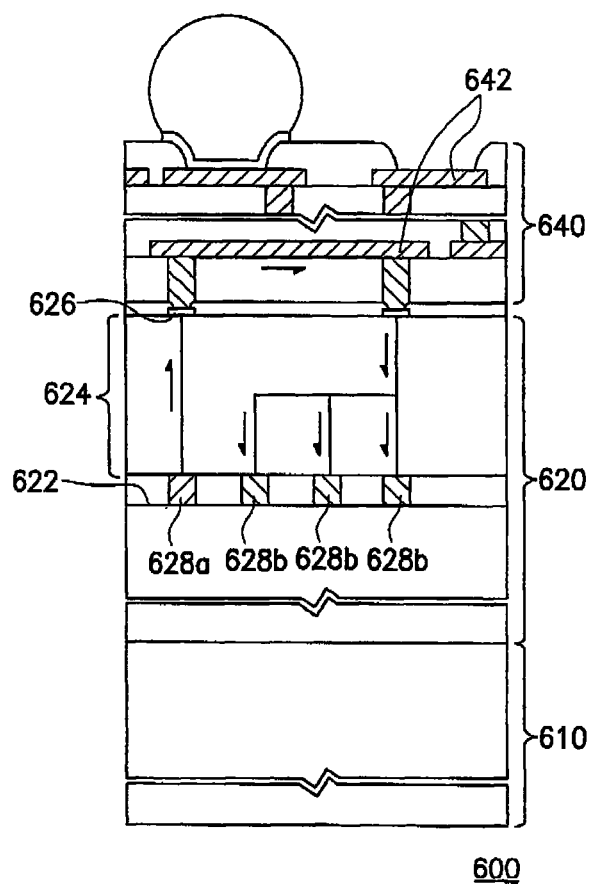
FIG. 8 is a magnified diagram showing the sectional view of the chip package structure of a preferred embodiment of the present invention.

Please refer to FIG. 8, it illustrates a magnified view of the sectional view of the chip package structure of the present invention. Active surface 622 of die 620 has a plurality of active devices 628a, 628b, and an internal circuitry 624. The internal circuitry 624 forms a plurality of metal pads 626 on the surface of die 620. Therefore signals are transmitted from active devices 628a to external circuitry 642 via internal circuitry 624 of die 620, and from external circuitry 642 back to another active device 628b via internal circuitry 624. The traces of external circuitry 642 are wider, longer, and thicker than that of internal circuitry 624 for providing an improved transmission path.

Figure 9A:
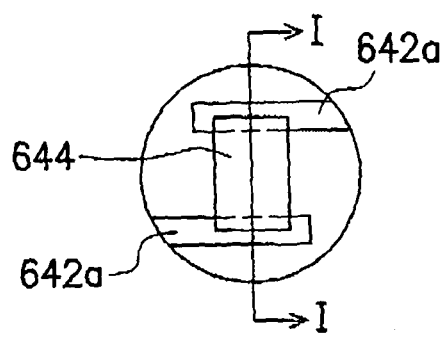
FIGS. 9A, 9B are schematic diagrams of the top and side view respectively of the patterned wiring layer of the thin-film circuit layer with a passive device.
Figure 9B:
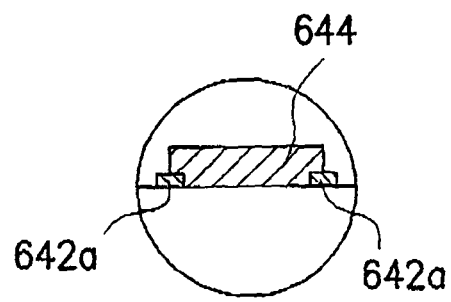
Figure 10A:
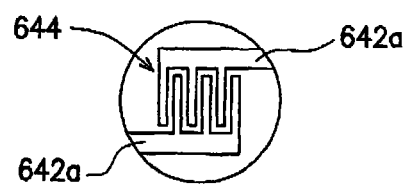
FIG. 10A is a schematic diagram of the formation of a passive device by a single layer of patterned wiring layer of the thin-film circuit layer.
Figure 10B:
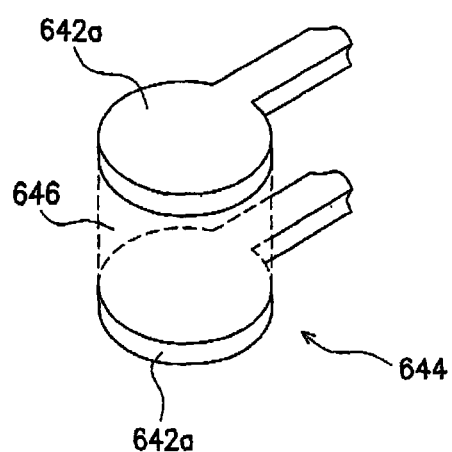
FIG. 10B is a schematic diagram of the formation of a passive device by a double layer of patterned wiring layer of the thin-film circuit layer.
Figure 11A:
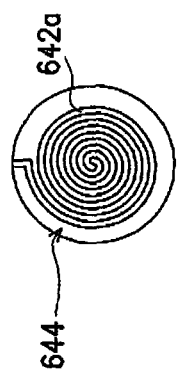
FIG. 11A is a schematic diagram of the formation of a passive device by a single layer of patterned wiring layer of the thin-film circuit layer.
Figure 11B:
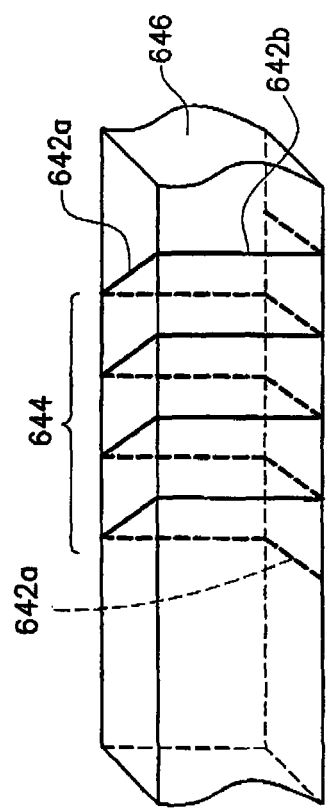
FIG. 11B is a schematic diagram of the formation of a passive device by a double layer of patterned wiring layer of the thin-film circuit layer.

Please continue to refer to FIG. 6, external circuitry 642 further comprises at least one passive device 644 including a capacitor, an inductor, a resistor, a wave-guide, a filter, a micro electronic mechanical sensor (MEMS), or the like. Passive device 644 can be located on a single layer of patterned wiring layer 642a or between two layers of patterned wiring layers 642a. In FIGS. 9A, 9B, passive device 644 can be formed by printing or other method on two bonding points on patterned wiring layer 642a when forming thin-film layer 640. In FIG. 10A, a comb-shape passive device 644 (such as a comb capacitor) is formed directly on a single patterned wiring layer. In FIG. 10B, passive device 644 (such as a capacitor) is formed between two layers of patterned wiring layers 642a with an insulating material 646 in between. Wherein the original dielectric layer (not shown) can replace insulating material 646. In FIG. 11A, passive device 644 (such as an inductor) is formed by making a single layer of patterned wiring layer 642a into a circular or square (not shown) spiral. In FIG. 11B, colurrmn-shape passive device 644 (such as an inductor) is formed by using two layers of patterned wiring layers 642a and a plurality of vias 642b to surround an insulating material 646 forming a column. In FIG. 11C, circular-shaped passive device 644 (such as an inductor) is formed by using slanted traces from two layers of patterned wiring layers and a plurality of vias 642b to surround an insulating material 646 in a circular manner forming a pie. The above structures allow the original externally welded passive devices to be integrated into the inside of the chip package structure.

Figure 7:
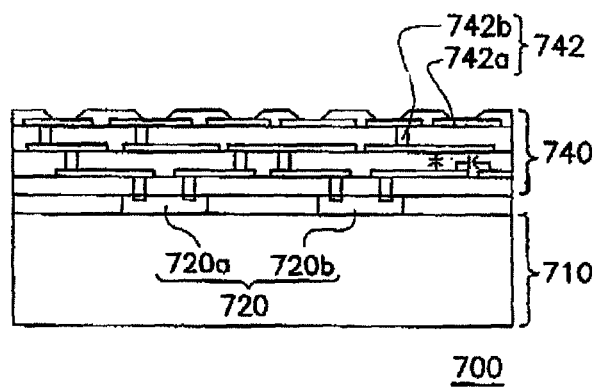
FIG. 7 is a schematic diagram showing the sectional view of the chip package structure of a preferred embodiment of the present invention with a plurality of dies.

FIG. 6 illustrates a chip package structure 600 for a single die 620 but FIG. 7 illustrates a chip package structure 700 for a plurality of dies. Chip package structure 700 in FIG. 7 differs from chip package structure 600 in FIG. 6 by having a die module 720, which comprises at least one or more dies such as die 720a, 720b. Die 720a, 720b are electrically connected by the external circuitry of the thin-film circuit layer. The function of die 720a, 720b can be the same or different and can be integrated together by external circuitry 742 to form a multi-die module (MCM) by packaging same or different dies into one chip package structure. When multiple dies are packaged into the same chip package structure, singulation process is performed on the determined number of dies.

Following the above, the present invention provides a chip packaging method by adhering a die to a silicon substrate or to an inwardly protruded area of a silicon substrate, and forming a thin-film circuit layer with bonding pads and points above the die and silicon substrate. This structure can fan out the metal pads on the die to achieve a thin chip package structure with high pin count.

Comparing to the BGA or PGA package technique used in the prior art, the chip package of the present invention is performed directly on the die and the silicon substrate for fanning out the metal pads on the die. It does not require flip chip or wire bonding to connect the die to the micro-spaced contact points of a package substrate or carrier. The present invention can reduce cost because the package substrate with micro-spaced contacts is very expensive. Moreover the signal transmission path of the present invention is reduced to lessen the effect of signal delay and attenuation, which improves the performance of the die.

Furthermore, the coefficient of thermal expansion (CTE) of the chips and silicon substrate is identical so thermal stress is greatly reduced between the chips and silicon substrate because the expansion between the metal traces on the silicon substrate and the chips is prevented. Consequently, the life span and durability of the chips are increased. Wafer level packaging technique, that is the technique on packaging the chips directly on a chip Wafer, is already well know in the art. Therefore the present invention can adapt currently available chip scale packaging machine to fabricate the silicon substrate using blank silicon chip wafer. As a result the cost fabricating the silicon substrate is greatly reduced and practicality and applicability of the present invention is increased.

Furthermore, the third embodiment of the present invention provides an integrated substrate comprises a silicon layer and a heat conducting layer. A plurality of openings can be pre-formed on the silicon layer by etching so inwardly protruded areas are formed for inlaying the die when the silicon layer overlaps the heat conducting layer. The heat conducting layer helps to dissipate heat to the outside from the die during operation, which will effectively increase performance. Moreover the CTE of the chips and the silicon substrate is identical so life span and durability of the chips after packaging are increased. The thin-film layer circuit of the present invention is used to transmit signals between two main active devices inside the die, or used as a power/ground bus, or used to add in passive devices. Furthermore, the chip package structure of the present invention can accommodate one or more dies with similar or different functions. The external circuitry of the thin-film circuit layer connects the multiple dies together and can be used in a MCM package. The chip package structure of the present invention adapts the MCM, the external circuitry of the thin-film circuit layer, the passive devices of the external circuitry to form a package that is "system in package".

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package comprising:
   a substrate having a surface;
   a die-surrounding layer directly on said surface of said substrate;
   a die having a backside surface directly on said surface of said substrate, said die disposed between a first portion of said die-surrounding layer and a second portion of said die-surrounding layer, wherein said die has an active surface substantially coplanar with a first surface of said die-surrounding layer, wherein said die comprises a conductive pad within said active surface of said die;
   a first dielectric layer on said active surface of said die and said first surface of said die-surrounding layer;
   a first patterned conductive layer on said first dielectric layer, on said active surface of said die and on said first surface of said die-surrounding layer, wherein said first patterned conductive layer is coupled to said conductive pad of said die through an opening in said first dielectric layer;
   a second dielectric layer on said first patterned conductive layer and on said first dielectric layer;
   a second patterned conductive layer on said second dielectric layer, wherein said second patterned conductive layer is coupled to said first patterned conductive layer through an opening in a said second dielectric layer, in which said second patterned conductive layer comprises a portion configured for external coupling of said die; and
   a comb-shaped capacitor disposed between said first patterned conductive layer and said second patterned conductive layer.

2. The chip package in claim 1, wherein said comb-shaped capacitor is aligned with said first portion of said die-surrounding layer.

3. The chip package in claim 1, wherein said first dielectric layer comprises polyimide.

4. The chip package in claim 1, wherein said first dielectric layer comprises benzocyclobutene (BCB).

5. The chip package in claim 1, wherein said first patterned conductive layer comprises electroplated copper.

6. The chip package in claim 1, wherein said second dielectric layer comprises polyimide.

7. The chip package in claim 1, wherein said second dielectric layer comprises benzocyclobutene (BCB).

8. The chip package in claim 1 further comprising multiple solder bumps, configured for external connection, aligned with said first surface of said die-surrounding layer.

9. The chip package in claim 1 further comprising multiple gold bumps, configured for external coupling being aligned with said first surface of said die-surrounding layer.

10. The chip package in claim 1, wherein said substrate comprises a silicon substrate.

11. The chip package in claim 1, wherein said die-surrounding layer comprises epoxy.

12. A chip package comprising:
    a substrate having a surface;
    a die-surrounding layer directly on said surface of said substrate;
    a die having a backside surface directly on said surface of said substrate, said die disposed between a first portion of said die-surrounding layer and a second portion of said die-surrounding layer, wherein said die has an active surface substantially coplanar with a first surface of said die-surrounding layer, wherein said die comprises a first conductive pad and a second conductive pad within said active surface;
    a first dielectric layer on said active surface of said die and on said first surface of said die-surrounding layer; and
    a patterned conductive layer on said first dielectric layer, on said active surface of said die and on said first surface of said die-surrounding layer, wherein said patterned conductive layer is coupled to said first conductive pad of said die through a first opening in said first dielectric layer, and wherein said patterned conductive layer is coupled to said second conductive pad of said die through a second opening in said first dielectric layer, wherein said first conductive pad is coupled to said second conductive pad through said patterned conductive layer, wherein said patterned conductive layer comprises a portion of a passive device formed in said patterned conductive layer in a single horizontal plane and a portion configured for external coupling of said die.

13. The chip package in claim 12, wherein said die-surrounding layer comprises epoxy.

14. The chip package in claim 12 further comprising multiple solder bumps, configured for external connection, vertically over said first surface of said die-surrounding layer.

15. The chip package in claim 12, wherein said first dielectric layer comprises polyimide.

16. The chip package in claim 12, wherein said first dielectric layer comprises benzocyclobutene (BCB).

17. The chip package in claim 12 further comprising a second dielectric layer on said patterned conductive layer and on said first dielectric layer.

18. The chip package in claim 17, wherein said second dielectric layer comprises polyimide.

19. The chip package in claim 17, wherein said second dielectric layer comprises benzocyclobutene (BCB).

20. The chip package in claim 12, wherein said patterned conductive layer comprises a ground bus coupling said first conductive pad to said second conductive pad.

21. The chip package in claim 12, wherein said patterned conductive layer comprises a power bus coupling said first conductive pad to said second conductive pad.

22. The chip package in claim 12, wherein said patterned conductive layer comprises a signal trace coupling said first conductive pad to said second conductive pad.

23. The chip package in claim 12, wherein said passive device comprises a micro electro mechanical sensor.

24. The chip package in claim 12, wherein said passive device comprises an inductor.

25. The chip package in claim 12, wherein said passive device comprises a capacitor.

26. The chip package in claim 12, wherein said passive device comprises a resistor.

27. The chip package in claim 1, wherein said substrate comprises a silicon substrate.

28. The chip package in claim 12, wherein said portion of said passive device is aligned with said first portion of said die-surrounding layer.

29. A chip package comprising:
a substrate having a surface;
a die-surrounding layer directly on said surface of said substrate;
a die having a backside surface directly on said surface of said substrate, said die disposed between a first portion of said die-surrounding layer and a second portion of said die-surrounding layer, wherein said die has an active surface substantially coplanar with a first surface of said die-surrounding layer, wherein said die comprises a first conductive pad and a second conductive pad within said active surface;
a first dielectric layer on said active surface of said die and on said first surface of said die-surrounding layer; and
a patterned conductive layer on said first dielectric layer, on said active surface of said die and on said first surface of said die-surrounding layer, wherein said patterned conductive layer comprises a ground piece coupled to said first conductive pad of said die through a first opening in said first dielectric layer, and coupled to said second conductive pad of said die through a second opening in said first dielectric layer, wherein said first conductive pad is coupled to said second conductive pad through said ground piece, wherein said patterned conductive layer comprises a portion of a passive device formed in said patterned conductive layer and a portion configured for external coupling of said die.

30. The chip package in claim 29, wherein said passive device comprises an inductor.

31. The chip package in claim 29, wherein said passive device comprises a resistor.

32. The chip package in claim 29, wherein said die-surrounding layer comprises epoxy.

33. The chip package in claim 29, wherein said passive device comprises a capacitor.

34. The chip package in claim 29, wherein said first dielectric layer comprises polyimide.

35. The chip package in claim 29 further comprising a second dielectric layer on said patterned conductive layer and said first dielectric layer.

36. The chip package in claim 29, wherein said first dielectric layer comprises benzocyclobutene (BCB).

37. The chip package in claim 29 further comprising multiple solder bumps, configured for external coupling aligned with said first surface of said die-surrounding layer.

38. The chip package in claim 29 further comprising a substrate supporting said die and said first and second portions of said die-surrounding layer.

39. The chip package in claim 29, wherein said substrate comprises a silicon substrate.

40. The chip package in claim 29, wherein said passive device comprises a micro electro mechanical sensor.

41. The chip package in claim 29, wherein said patterned conductive layer comprises electroplated copper.

42. The chip package in claim 12, wherein said patterned conductive layer comprises electroplated copper.

* * * * *